US012748165B2

(12) United States Patent
Deguchi et al.

(10) Patent No.: US 12,748,165 B2
(45) Date of Patent: Sep. 29, 2026

(54) DIAMOND MAGNETO-OPTICAL SENSOR

(71) Applicant: SUMITOMO ELECTRIC INDUSTRIES, LTD., Osaka (JP)

(72) Inventors: Hiroshige Deguchi, Kyoto (JP); Natsuo Tatsumi, Kyoto (JP); Tsukasa Hayashi, Kyoto (JP); Yoshiki Nishibayashi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 125 days.

(21) Appl. No.: 18/283,751

(22) PCT Filed: Mar. 29, 2022

(86) PCT No.: PCT/JP2022/015393

§ 371 (c)(1),
(2) Date: Sep. 22, 2023

(87) PCT Pub. No.: WO2022/210695

PCT Pub. Date: Oct. 6, 2022

(65) Prior Publication Data

US 2024/0175945 A1 May 30, 2024

(30) Foreign Application Priority Data

Mar. 31, 2021 (JP) ................................ 2021-059798

(51) Int. Cl.
*G01R 33/032* (2006.01)
*G01R 33/00* (2006.01)

(52) U.S. Cl.
CPC ....... *G01R 33/032* (2013.01); *G01R 33/0047* (2013.01)

(58) Field of Classification Search
CPC ........ G02B 6/32; G02B 6/4202; G01R 33/26; G01R 33/0005; G01R 33/0017; G01R 33/032; G01R 33/0354
See application file for complete search history.

(56) References Cited

U.S. PATENT DOCUMENTS

2011/0062957 A1* 3/2011 Fu ....................... G01N 24/088 324/307
2015/0192532 A1 7/2015 Clevenson
(Continued)

FOREIGN PATENT DOCUMENTS

CN 104133259 A * 11/2014 ........... G01R 33/032
CN 105372726 A 3/2016
(Continued)

OTHER PUBLICATIONS

Yuta Masuyama, Yuji Hatano, Takayuki Iwasaki, Mutsuko Hatano, "Highly sensitive macro-scale diamond magnetometer operated with coplanar waveguide resonator", the 79th JSAP Autumn Meeting Extended Abstracts (issued on Sep. 5, 2018) (cited in specification).
(Continued)

*Primary Examiner* — Lee E Rodak
*Assistant Examiner* — Taqi R Nasir
(74) *Attorney, Agent, or Firm* — Renner, Otto, Boisselle & Sklar, LLP

(57) ABSTRACT

A diamond magneto-optical sensor includes: a diamond including a color center with an electronic spin, and a reflecting surface that reflects excitation light propagated through an optical system into the diamond, wherein the reflecting surface reflects light radiated from the color center excited by the excitation light and condenses the light in the direction of the optical system.

3 Claims, 15 Drawing Sheets

(56) References Cited

U.S. PATENT DOCUMENTS

| | | | | |
|---|---|---|---|---|
| 2017/0023487 | A1 | 1/2017 | Boesch | |
| 2017/0343695 | A1* | 11/2017 | Stetson | G01V 3/101 |
| 2017/0370979 | A1* | 12/2017 | Braje | G01R 29/0885 |
| 2022/0146605 | A1* | 5/2022 | Frangeskou | G01R 33/445 |
| 2023/0194448 | A1 | 6/2023 | Hashimoto et al. | |

FOREIGN PATENT DOCUMENTS

| | | | | | |
|---|---|---|---|---|---|
| CN | 111678896 | A | | 9/2020 | |
| CN | 111679098 | A | | 9/2020 | |
| CN | 111896511 | A | | 11/2020 | |
| DE | 102018219750 | A1 | | 5/2020 | |
| JP | 07-041388 | A | | 2/1995 | |
| JP | 2006062923 | A | * | 3/2006 | C30B 29/04 |
| JP | 2017-67650 | A | | 4/2017 | |
| JP | 2017067650 | A | * | 4/2017 | G01N 21/64 |
| JP | 2017-146158 | A | | 8/2017 | |
| JP | 2020-106352 | A | | 7/2020 | |
| JP | 2020-176994 | A | | 10/2020 | |
| KR | 10-2021-0075402 | A | | 6/2021 | |
| WO | 2020/157497 | A1 | | 8/2020 | |
| WO | 2021/246064 | A1 | | 12/2021 | |

OTHER PUBLICATIONS

Duan, Dewen. Ka Vat Amane, Vinaya Kumar. Arumugam, Sri Ranjini. Rahane, Ganesh. Tzeng, Yankai. Chang, Huancheng. Sumiya, Hitoshi. Onoda, Shinobu. Iso Ya, Junichi. Balasubramanian, Gopalakrishnan. Enhancing fluorescence excitation and collection from the nitrogen-vacancy center in diamond through a micro-concave mirror. Applied Physics Letters 113, 041107 (2018). Jul. 27, 2018, pp. 041107-1 to 041107-5, DOI: 10.1063/1.5037807.

Sharma, Sarvagya. Hovde, Chris. Beck, Douglas. Diamond-based field sensor for nEDM experiment. Proceedings of SPIE 9755, Quantum Sensing and Nano Electronics and Photonics XIII. 97552U. Feb. 13, 2016, DOI: 10.1117/12.2211910.

Duan, et al., "Efficient nitrogenvacancy centers' fluorescence excitation and collection from micrometer-sized diamond by a tapered optical fiber in endoscopetype configuration", Optics Express, vol. 27, No. 5, Feb. 22, 2019, pp. 6734-6745.

Xu, et al., "High-efficiency fluorescence collection for NV-center ensembles in diamond", Optics Express, vol. 27, No. 8, Apr. 3, 2019, p. 10787-10797.

Wan, et al., "Efficient Extraction of Light from a Nitrogen-Vacancy Center in a Diamond Parabolic Reflector", Nano Letters, vol. 18, No. 5, Mar. 30, 2018, pp. 2787-2793.

* cited by examiner

DIAMOND MAGNETO-OPTICAL SENSOR

TECHNICAL FIELD

The present disclosure relates to a diamond magneto-optical sensor. The present application claims priority under Japanese Patent Application Nc. 2021/059798 filed on Mar. 31, 2021, which is incorporated herein by reference.

BACKGROUND ART

A magneto-optical sensor using the center of NV (hereinafter referred to as a NV center) in diamond is known. When nitrogen at a substitution position of carbon in diamond and an NV center having a vacancy next to the nitrogen are negatively charged, the ground state becomes a triplet state (that is, a spin S=1). The NV center excited at a wavelength 532 nm (that is, green light) emits fluorescence at a wavelength 637 nm (that is, red light). The radiant intensity of fluorescence changes according to a spin state. The spin state is changed by magnetic resonance occurring due to a magnetic field applied to the NV center and microwaves or radio waves, which is applicable to a diamond magneto-optical sensor.

A diamond magneto-optical sensor includes a diamond substrate containing an NV center, an optical system that transmits excitation light from a light source and emits the light to the NV center, an optical system that condenses fluorescence from the NV center and transmits the fluorescence to a photodetector, and a waveguide that transmits microwaves from a power supply and emits the microwaves to the NV center.

For example, NPL 1 discloses a configuration for emitting microwaves with a diamond sensor placed on a coplanar waveguide. A diamond substrate is shaped like a rectangular solid. Excitation light is laterally emitted to the diamond substrate, and fluorescence is condensed from a position above the diamond substrate.

CITATION LIST

Non Patent Literature

NPL 1: "Highly sensitive macro-scale diamond magnetometer operated with coplanar waveguide resonator", Yuta Masuyama, Yuji Hatano, Takayuki Iwasaki, Mutsuko Hatano, the 79th JSAP Autumn Meeting Extended Abstracts (issued on Sep. 5, 2018)

SUMMARY OF INVENTION

A diamond magneto-optical sensor according to an aspect of the present disclosure includes: a diamond including a color center with an electronic spin, and a reflecting surface that reflects excitation light propagated through an optical system into the diamond, wherein the reflecting surface reflects light radiated from the color center excited by the excitation light and condenses the light in the direction of the optical system.

A diamond magneto-optical sensor according to another aspect of the present disclosure includes: a diamond including a color center with an electronic spin, a small portion that allows excitation light propagated through an optical system to be emitted into the diamond, and a reflecting surface that reflects radiated light radiated from the color center excited by the excitation light incident from the small portion and condenses the light in the direction of a light-receiving optical system that guides the light to a light-receiving element, wherein the reflecting surface has a larger area than the small portion and guides light radiated from the same position in different directions, to the light-receiving optical system through a plurality of optical paths.

DETAILED DESCRIPTION

Figure 1:
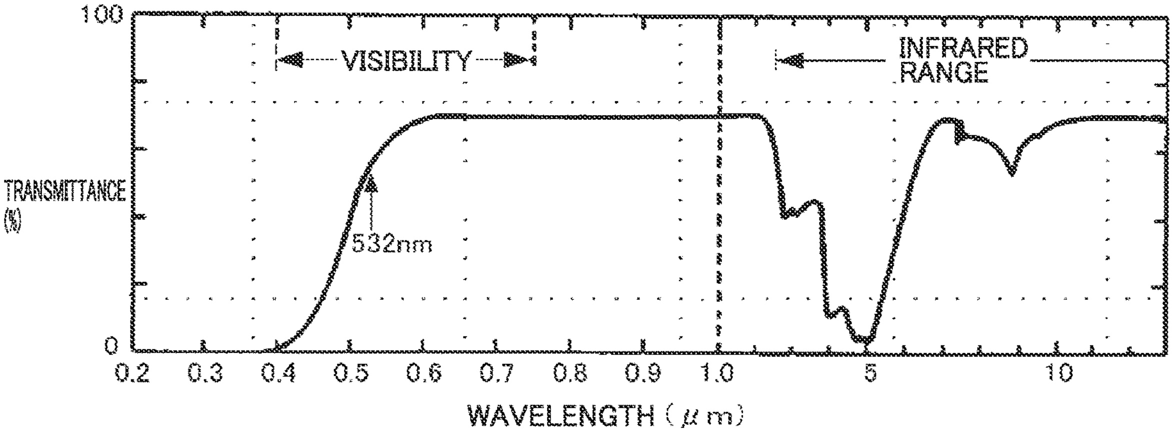
FIG. 1 is a graph showing the transmittance of light of a type Ib diamond.

Problem to be Solved by the Present Disclosure

An optical system for transmitting excitation light from a light source and emits the light to an NV center initializes the spin state of the NV center and emits excitation light in order to read subsequent changes. In order to obtain high responsivity and sensitivity as a magneto-optical sensor, excitation light needs to be emitted to the NV center with maximum uniformity and intensity over the widest range.

An optical system for condensing fluorescence from the NV center and transmitting the fluorescence to a photodetector condenses fluorescence that changes due to the spin state of the NV center. In order to obtain high responsivity and sensitivity as a magneto-optical sensor, fluorescence from the NV center needs to be condensed with maximum efficiency over the widest range.

In other words, it is preferable to improve the condensing efficiency of fluorescence radiated from the NV center of diamond, the absorption efficiency of excitation light for exciting the NV center, and the radiation power density of excitation light. The problems will be specifically described below.

(Condensing Efficiency of Fluorescence)

ϕc denotes the diameter of the core of an optical fiber for transmitting fluorescence, Nc denotes a numerical aperture, n denotes the refractive index of diamond, ϕd denotes the diameter of an area where fluorescence can be condensed from the NV center in diamond, dd denotes a depth where fluorescence can be condensed, and Nd denotes a numerical aperture that allows condensing of fluorescence. In this case, the law of Lagrangian invariant and refraction on a diamond surface restrict the product of ϕd and Nd as follows:

$$\phi d \times Nd < \phi c \times Nc/n \quad \text{(Formula 1)}$$

Moreover, dd is determined as follows:

$$dd = \phi d/Nd \quad \text{(Expression 2)}$$

For example, if diamond is disposed in contact with the core on one end of an optical fiber, ϕc=ϕd can be suggested and Formula 3 is introduced from Formula 1.

$$Nd < Nc/n \quad \text{(Formula 3)}$$

Numerical aperture Nc of a commercial optical fiber ranges from about 0.07 to about 0.5. Even if an optical fiber with a large numerical aperture (e.g., Nc=0.5) is selected for use, refractive index n of diamond is about 2.5 and thus numerical aperture Nd that allows condensing is determined as Nd<0.2 from Formula 3. Thus, on the assumption that fluorescence from the NV center is randomly radiated substantially over the sky, a condensing rate η of fluorescence that reaches the end face of the optical fiber and is transmitted through the optical fiber is determined as expressed in Expression 4 with respect to a solid angle 4πsr (steradian) over the sky.

$$\eta \approx (0.2 \times 0.2 \times \pi)/(4 \times \pi) = 0.01 \quad \text{(Expression 4)}$$

Hence, the maximum efficiency remains at 1%.

For example, light may be condensed with an objective lens disposed between diamond and the core of the end face of the optical fiber. In this case, if the objective lens has a numerical aperture Nt, the efficiency is maximized when an optical system has a magnification of Nt/Nc. Also in this case, however, ϕd=Nc×ϕc/Nt is determined and numerical aperture Nd is limited as expressed in Formula 5.

$$Nd < NT/n \quad \text{(Formula 5)}$$

Since maximum numerical aperture Nt of the objective lens remains at about 1, even a combination with an optical fiber with a large numerical aperture Nc (e.g., Nc=0.5) determines refractive index n of diamond at about 2.5, so that Nd<0.4 is obtained from Formula 5. Thus, condensing rate n of fluorescence that reaches the end face of the optical fiber and is transmitted through the optical fiber is determined as expressed in Expression 6.

$$\eta \approx (0.4 \times 0.4 \times \pi)/(4 \times \pi) = 0.04 \quad \text{(Expression 6)}$$

Hence, the maximum efficiency remains at 4%.

As described above, if the optical fiber is used for transmitting fluorescence from the NV center to the photodetector for the convenience of measurement of high-voltage power equipment, the condensing rate of fluorescence from the NV center remains at about several percents at the most.

As a theoretical formula of sensitivity δB (that is, the resolution of a detected magnetic field B) of the diamond magneto-optical sensor, Formula 7 expressed below is known.

[Formula 1]

$$\delta B \sim \frac{1}{\gamma\sqrt{\eta}}\frac{1}{C}\frac{1}{\sqrt{NT_2}}\left(T/\sqrt{\text{Hz}}\right) \quad \text{Formula 7}$$

In Formula 7, γ is a gyromagnetic ratio (that is, a constant) that is a value close to the gyromagnetic ratio of an electron ($1.76\times10^{11}$ rad/s/T). η is the detection efficiency of fluorescence, that is, condensing efficiency that remains at several percents as described above. C is a spin detection contrast ratio (that is, a decreasing rate of red light brightness), which will be described later. N is the number of NV centers that are irradiated with excitation light and carry negative electrical charge in an area where fluorescence is condensed. $T_2$ is a transverse relaxation time of an electronic spin. According to the theoretical formula of sensitivity (Formula 7), light quantum noise determines the limit of measurement sensitivity in the magneto-optical sensor. Thus, high condensing efficiency η of fluorescence is preferable but the condensing efficiency of fluorescence is several percents, which is not sufficiently high.

(Absorption Efficiency of Excitation Light)

In order to initialize the spin state of the NV center and read subsequent changes, excitation light at a wavelength of 532 nm is emitted. For the light source of excitation light, a green-light semiconductor laser or a YAG second-harmonic-wave solid state laser is easy to use. Diamond is classified depending upon the presence or absence of impurity or the kind of impurity. Type Ib containing a nitrogen atom as impurity (that is, including an NV center) looks relatively yellow with low transmittance among kinds of diamond. FIG. 1 shows the transmittance of light of type Ib diamond. The vertical axis indicates transmittance (%) and the horizontal axis indicates a wavelength (μm). In FIG. 1, scales are different from a wavelength of 1.0 μm on the horizontal axis. As shown in FIG. 1, a certain amount of green light at a wavelength of 532 nm (that is, 0.532 μm) passes through type Ib diamond, so that an absorption length for absorbing light into diamond exceeds several mm. If a diamond substrate has a short optical path (for example, a small thickness), excitation light mostly passes through the substrate, resulting in poor absorption efficiency of excitation light.

(Radiation Power Density of Excitation Light)

Figure 2:
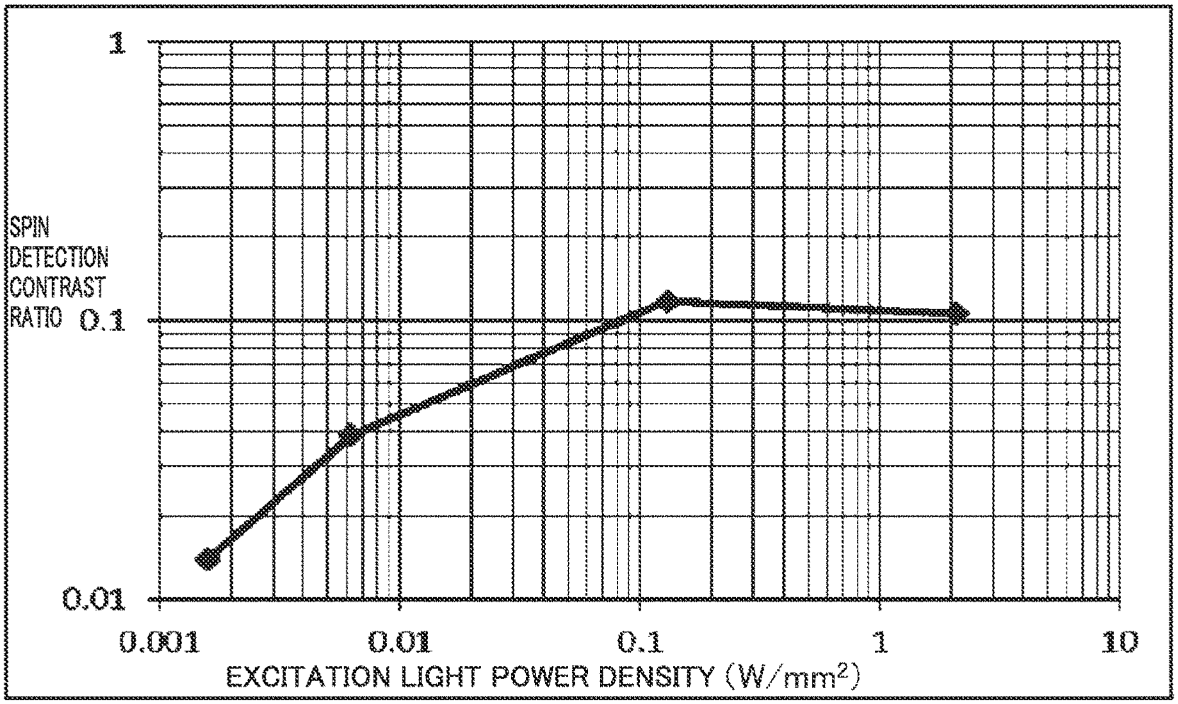
FIG. 2 is a graph showing the relationship between a spin detection contrast ratio and power density of excitation light.

For the NV center formed in the type-Ib diamond substrate, the relationship between a spin detection contrast ratio (that is, a decreasing rate of red light brightness) and the power density of excitation light was experimentally evaluated. The result is shown in FIG. 2. In FIG. 2, the vertical axis indicates a spin detection contrast ratio and the horizontal axis indicates the power density of excitation light. As shown in FIG. 2, in order to increase the spin detection contrast ratio to 0.06 or more to obtain high sensitivity as a magneto-optical sensor, excitation light needs to be emitted with a power density of 20 $mW/mm^2$ or more.

For the NV center formed in the type-Ib diamond substrate, the relationship between a response speed relative to a frequency change of microwaves (specifically, a time constant) and the power density of excitation light was experimentally evaluated. Consequently, it is understood that the power density of excitation light to be emitted needs to be increased to obtain a high response speed as a magneto-optical sensor.

Thus, an object of the present disclosure is to provide a diamond magneto-optical sensor that obtains high condensing efficiency of fluorescence and high absorption efficiency and power density of excitation light.

Advantageous Effect of the Present Disclosure

The present disclosure can provide a diamond magneto-optical sensor that obtains high condensing efficiency of fluorescence and high absorption efficiency and power density of excitation light.

Description of Embodiment of the Present Disclosure

The contents of an embodiment of the present disclosure will be described in list form. At least parts of the embodiment below may be combined as required.

(1) A diamond magneto-optical sensor according to a first aspect of the present disclosure includes: a diamond including a color center with an electronic spin, and a reflecting surface that reflects excitation light propagated through an optical system into the diamond, wherein the reflecting surface reflects light radiated from the color center excited by the excitation light and condenses the light in the direction of the optical system. This can obtain higher condensing efficiency of fluorescence and higher absorption efficiency and power density of excitation light. Thus, the responsivity and sensitivity of the diamond magneto-optical sensor can be improved.

(2) The excitation light is emitted to the diamond from the output part of an optical fiber, and the reflecting surface is capable of condensing the radiated light at the output part of the optical fiber. This can obtain higher condensing efficiency of fluorescence and higher absorption efficiency and power density of excitation light. Thus, the responsivity and sensitivity of the diamond magneto-optical sensor can be improved.

(3) A diamond magneto-optical sensor according to a second aspect of the present disclosure includes: a diamond including a color center with an electronic spin, a small portion that allows excitation light propagated through an optical system to be emitted into the diamond, and a reflecting surface that reflects radiated light radiated from the color center excited by the excitation light incident from the small portion and condenses the light in the direction of a light-receiving optical system that guides the light to a light-receiving element, wherein the reflecting surface has a larger area than the small portion and guides the light radiated from the same position in different directions, to the light-receiving optical system through a plurality of optical paths. This can obtain higher condensing efficiency of fluorescence and higher absorption efficiency and power density of excitation light. Thus, the responsivity and sensitivity of the diamond magneto-optical sensor can be improved.

(4) The excitation light may be emitted to the diamond from the output part of the optical fiber through the small portion, and the radiated light may condense at the output part of the optical fiber through the reflecting surface. This can obtain higher condensing efficiency of fluorescence and higher absorption efficiency and power density of excitation light. Thus, the responsivity and sensitivity of the diamond magneto-optical sensor can be improved.

(5) The diamond magneto-optical sensor may further include a member that contains the diamond and allows the passage of the excitation light and the radiated light, and the reflecting surface may be formed on the member. This can reduce the amount of expensive diamond, achieving cost-cutting of the diamond magneto-optical sensor.

(6) The reflecting surface may be formed on the diamond. This can eliminate the need for providing a member as a reflecting surface in addition to the diamond. Furthermore, a large difference in refractive index between the diamond and air allows a critical angle to be smaller on the reflecting surface, so that a compact sensor can be formed with high reflection efficiency.

(7) The reflecting surface may be formed on the member containing the diamond. Thus, the reflecting surface is machined only on the member having higher workability than the diamond, facilitating condensing of excitation light to the diamond. Moreover, a material having a refractive index close to that of the diamond is selected as the member. This can keep a large difference in refractive index from air, facilitate the entry of excitation light into the diamond, and reduce a critical angle on the reflecting surface, so that a compact sensor can be formed with high reflection efficiency.

(8) The reflecting surface may include a curved surface having a focal point or a plurality of planes. This can obtain higher condensing efficiency of fluorescence. In this case, the focal point may be a point of focusing at a position closer than a distance between two different optical paths or more incident on the diamond. The focal point is not limited to a so-called strict optical focal point. Focusing at a geometrical point is preferable, and focusing of a larger number of optical paths is more preferable.

(9) The diamond may have a flat surface and a spherical crown, and the reflecting surface may be formed by the spherical crown. Thus, the shape of the diamond can be easily designed with high condensing efficiency of fluorescence.

(10) The diamond may have two spherical crowns, and the reflecting surface may be formed by the first spherical crown of the two spherical crowns. Thus, the shape of the diamond can be easily designed with high condensing efficiency of fluorescence.

(11) The diamond may be shaped like a polyhedron, and the reflecting surface may be formed by a plurality of faces of the polyhedron. Thus, the diamond can be easily manufactured with high condensing efficiency of fluorescence.

(12) The reflecting surface may have a plane, and an angle formed on the incident side of the excitation light by a plane perpendicular to the incident axis of the excitation light and the plane may be 20° or more and 70° or less. Thus, the diamond can be easily obtained with high condensing efficiency of fluorescence.

(13) The angle formed by the plane perpendicular to the incident axis of the excitation light and the plane may be 30° or more and 50° or less. Thus, the diamond can be easily obtained with higher condensing efficiency of fluorescence.

(14) The diamond may have a corner cube. Thus, the diamond can be easily obtained with higher condensing efficiency of fluorescence.

(15) The member containing the diamond may have a corner cube. Thus, the diamond can be easily obtained with higher condensing efficiency of fluorescence.

(16) The optical system may include an optical fiber, and the size of the diamond may be one third or more and three times or less the core diameter of the optical fiber. Thus, excitation light transmitted through the optical fiber can be efficiently emitted into the diamond, and fluorescence radiated from the diamond can be efficiently emitted into the optical fiber.

(17) The optical system may include an optical fiber, and the size of the diamond may be as large as or larger than a shape inscribed in a circle having the core diameter of the optical fiber and may be as large as or smaller than a shape circumscribed around the circle. Thus, excitation light transmitted through the optical fiber can be efficiently emitted into the diamond, and fluorescence radiated from the diamond can be efficiently emitted into the optical fiber.

(18) The optical system may include an optical fiber and a lens, the excitation light propagated through the optical fiber may be outputted from the lens and emitted into the diamond magneto-optical sensor, the reflecting surface may condense, at the lens, the radiated light radiated from the color center, the magnification of the lens may be the reciprocal of the numerical aperture of the optical fiber, and the size of the diamond may be 80% or more and 120% or less of the product of the core diameter and the numerical aperture of the optical fiber. Thus, excitation light transmitted through the optical fiber can be efficiently emitted into the diamond through the lens, and fluorescence radiated from the diamond can be efficiently inputted to the optical fiber through the lens.

Detailed Description of Embodiment of Present Disclosure

In the following embodiment, the same components are indicated by the same reference numerals. The same components have identical names and functions. Thus, a detailed explanation thereof is not repeated.

Figure 3:
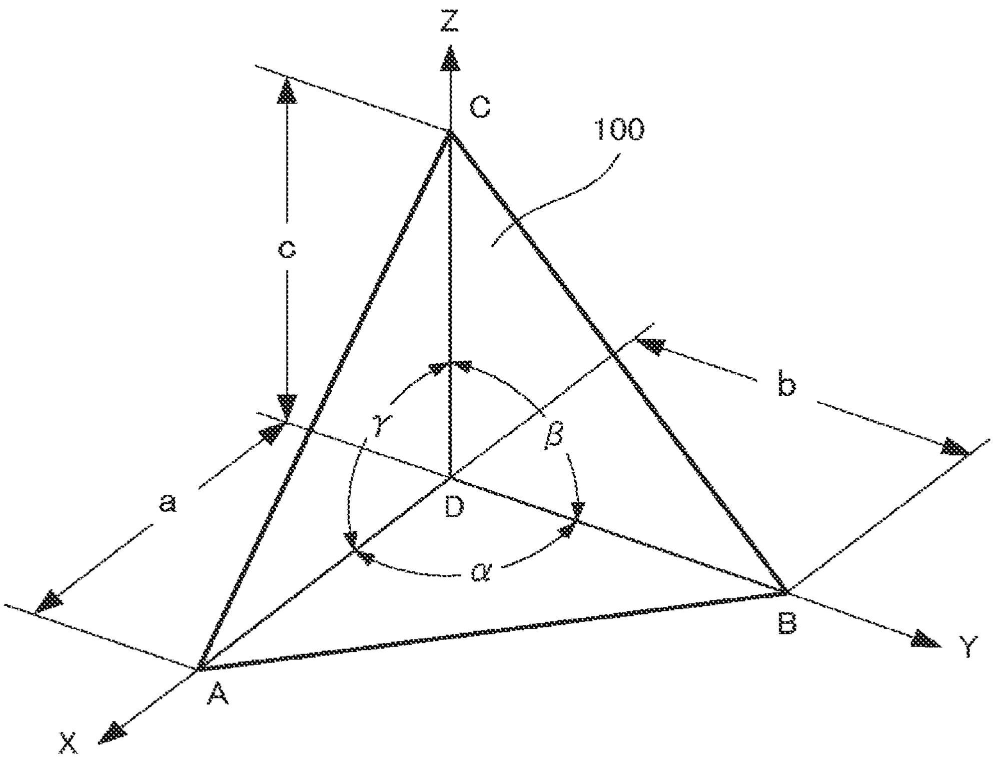
FIG. 3 is a perspective view illustrating a diamond magneto-optical sensor according to an embodiment of the present disclosure.

Referring to FIG. 3, a diamond magneto-optical sensor 100 according to the embodiment of the present disclosure is made of diamond including an NV center. Diamond magneto-optical sensor 100 is shaped like a tetrahedron. In FIG. 3, four points A, B, C, and D represent the apexes of the tetrahedron. The X axis, the Y axis, and the Z axis are indicated along sides AD, BD, and CD, respectively. Lengths a, b, and c represent the lengths of sides AD, BD, and CD, respectively. An angle $\alpha$ represents an angle formed by side AD and side BD. An angle $\beta$ represents an angle formed by side BD and side CD. An angle $\gamma$ represents an angle formed by side CD and side AD. The crystal orientation of diamond magneto-optical sensor 100 is arranged in any way and is not always specified by the X axis, the Y axis, and the Z axis.

If a magnetic field or the like is measured by using diamond magneto-optical sensor 100, for example, a face ABC is vertically irradiated with excitation light. Thus, the NV center in diamond magneto-optical sensor 100 is irradiated with the excitation light and fluorescence is radiated. Three faces (specifically, a face ABD, a face BCD, and a face ACD) other than face ABC (that is, an entrance surface) of diamond magneto-optical sensor 100 are polished into flat faces and are allowed to act as reflecting surfaces without providing mirrors (e.g., metallic coating or metallization). Fluorescence radiated in all directions can be internally reflected by face ABD, face BCD, and face ACD of diamond magneto-optical sensor 100, can be outputted from face ABC, and can be detected by a detector.

Angles α, β, and γ of diamond magneto-optical sensor 100 are freely set. Angles α, β, and γ are all preferably set at 90°. In this case, the shape of diamond magneto-optical sensor 100 is called a corner cube. Sides a, b, and c of diamond magneto-optical sensor 100 preferably satisfy 0.5b≤a≤1.5b and 0.5c≤a≤1.5c.

Figure 4:
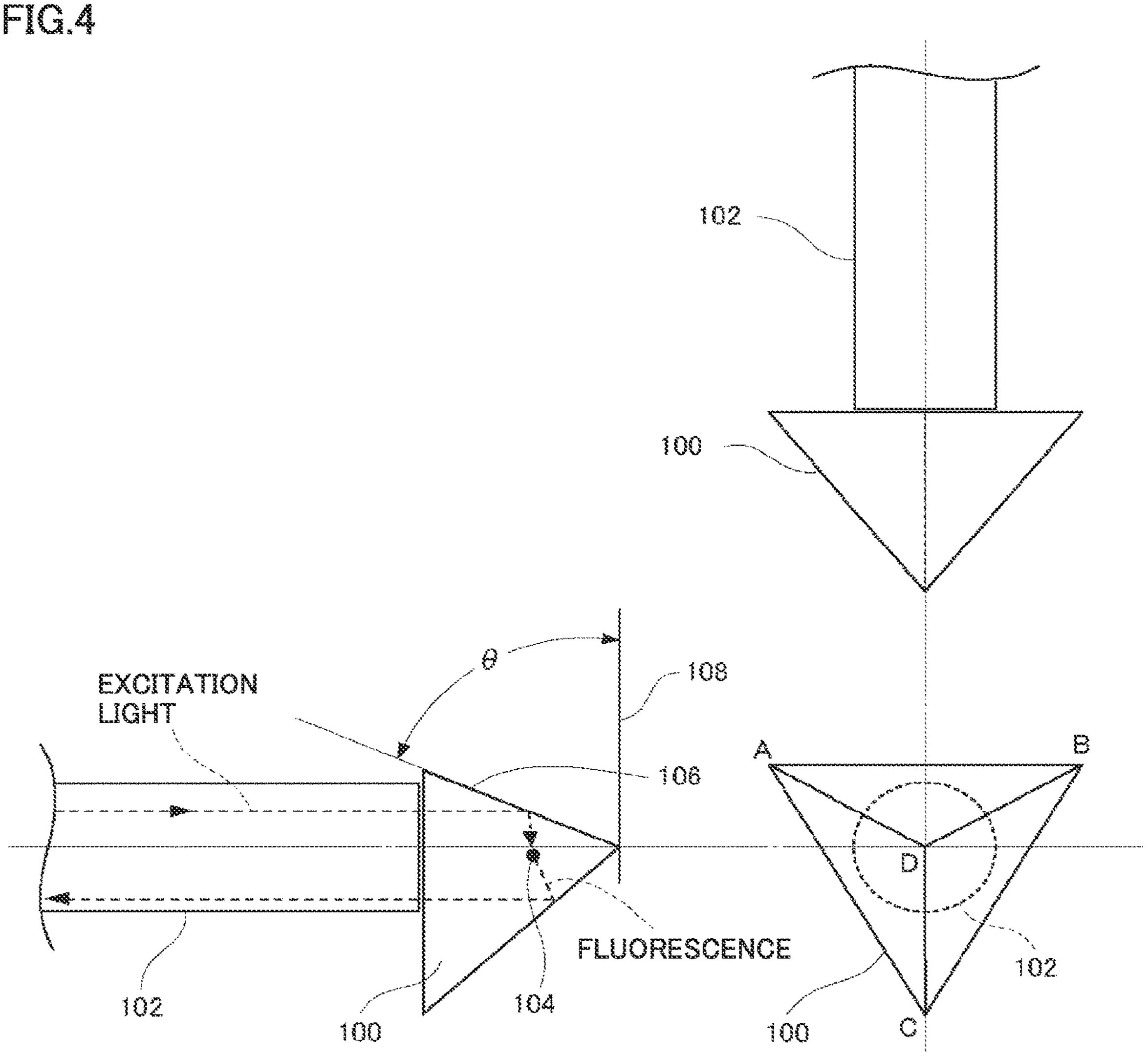
FIG. 4 is a three-view drawing illustrating the layout of the diamond magneto-optical sensor in FIG. 3 and an optical fiber.

Referring to FIG. 4, when a magnetic field is measured by using diamond magneto-optical sensor 100, diamond magneto-optical sensor 100 is disposed such that face ABC (see FIG. 3) faces one end (that is, the output part of excitation light) of an optical fiber 102. The lower right part of FIG. 4 indicates points A, B, C, and D that are the apexes of diamond magneto-optical sensor 100 illustrated in FIG. 3.

Optical fiber 102 only needs to be disposed next to (or in contact with) diamond magneto-optical sensor 100. Optical fiber 102 is preferably disposed with the optical axis located perpendicular to face ABC (that is, the entrance surface) of diamond magneto-optical sensor 100. Light (e.g., a wavelength of about 532 nm) outputted from a light source (e.g., a laser diode) is transmitted through optical fiber 102 as the excitation light of an NV center 104 of diamond magneto-optical sensor 100 and enters diamond magneto-optical sensor 100. Fluorescence emitted from NV center 104 is internally reflected by the reflecting surfaces (that is, face ABD, face BCD, and face ACD) of diamond magneto-optical sensor 100 as described above, is outputted from face ABC, and is transmitted to the detector through optical fiber 102.

At this point, if diamond has a refractive index of 2.4, the total reflection of a material with a refractive index of 2.4 has a critical angle of 24.6°, so that an angle θ(°) formed by a reflecting surface 106 (that is, face ABD) of diamond magneto-optical sensor 100 and a vertical plane 108 perpendicular to the optical axis of optical fiber 102 preferably satisfies 20≤θ≤70 (45−25≤θ≤45+25). For the reflecting surfaces, θ is set in this range (that is, diamond magneto-optical sensor 100 is formed with θ set in this range), so that light incident on the reflecting surfaces in diamond magneto-optical sensor 100 can be reflected to the front of diamond magneto-optical sensor 100 and in the direction of the central axis of optical fiber 102. This can increase the ratio of excitation light used for exciting the NV center and increase the ratio of fluorescence emitted into optical fiber 102. More preferably, 24.6≤θ≤65.4 (45−20.4≤θ≤45+20.4) is satisfied. Still more preferably, 38≤θ≤52 (45−(20.4/3) ≤θ≤45+(20.4/3)) is satisfied.

The size of diamond magneto-optical sensor 100 is preferably one third or more and three times or less of the core diameter (that is, the diameter of the core) of optical fiber 102. The size of diamond magneto-optical sensor 100 means, for example, the size of the circumcircle of a surface facing optical fiber 102 (that is, the entrance surface of excitation light). Moreover, it is preferable that the size of diamond magneto-optical sensor 100 is as large as or larger than a shape inscribed in a circle having the core diameter of optical fiber 102 and is as large as or smaller than a shape circumscribed around the circle. Thus, excitation light transmitted through optical fiber 102 can be efficiently emitted into diamond magneto-optical sensor 100 and fluorescence radiated from diamond magneto-optical sensor 100 can be efficiently emitted into the core of optical fiber 102.

Figure 5:
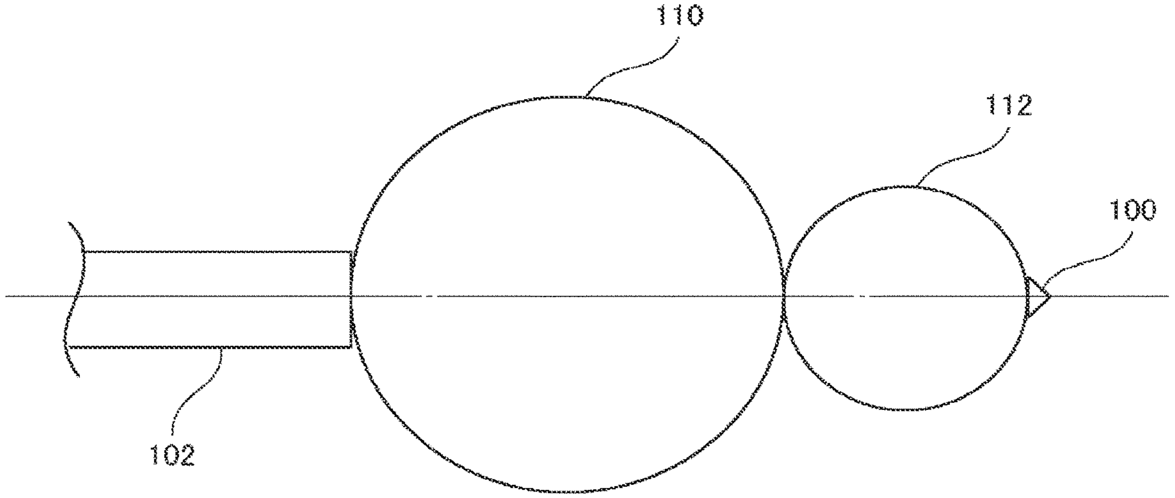
FIG. 5 is a side view illustrating a configuration in which a condensing element is disposed between the diamond magneto-optical sensor and the optical fiber.

Furthermore, a condensing element may be disposed between diamond magneto-optical sensor 100 and optical fiber 102. For example, referring to FIG. 5, condensing elements 110 and 112 are disposed between diamond magneto-optical sensor 100 and optical fiber 102. With this configuration, excitation light that is transmitted through optical fiber 102 and is outputted from the end of optical fiber 102 is condensed through condensing elements 110 and 112 and is emitted to diamond magneto-optical sensor 100. Fluorescence radiated from the NV center of diamond magneto-optical sensor 100 is condensed through condensing elements 112 and 110, is emitted to the end of the core of optical fiber 102, and is transmitted through optical fiber 102.

The magnification of a lens composed of condensing elements 110 and 112 is preferably the reciprocal of a numerical aperture NA (that is, 1/NA) of optical fiber 102. The size of diamond magneto-optical sensor 100 is preferably 80% or more and 120% or less of the product of a core diameter ϕ and numerical aperture NA of optical fiber 102 (that is, ϕ×NA). Thus, excitation light transmitted through optical fiber 102 can be efficiently emitted into diamond magneto-optical sensor 100 and fluorescence radiated from diamond magneto-optical sensor 100 can be efficiently emitted into the core of optical fiber 102.

Figure 6:
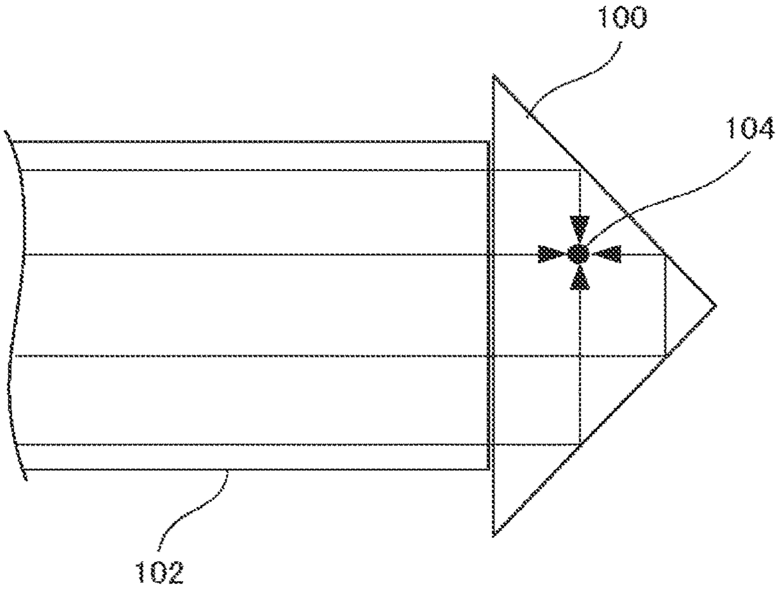
FIG. 6 is a schematic diagram illustrating an optical path for excitation light of an NV center, the excitation light being emitted into the diamond magneto-optical sensor.

In the foregoing description, excitation light and fluorescence are transmitted through optical fiber 102. The configuration is not limited thereto. Optical fiber 102 may be replaced with a light guide that is a bundle of a plurality of optical fiber cores. FIG. 6 illustrates an optical path for excitation light in diamond magneto-optical sensor 100. Referring to FIG. 6, excitation light (see arrows) transmitted from optical fiber 102 enters diamond magneto-optical sensor 100, is reflected by the plurality of reflecting surfaces (that is, face ABD, face BCD, and face ACD in FIG. 1) in diamond magneto-optical sensor 100, and is radiated to NV center 104. In other words, in addition to excitation light from the front (that is, from optical fiber 102), excitation light is radiated to NV center 104 in all directions including rearward, vertical, and horizontal directions. This can increase the radiation power density of excitation light radiated to the NV center. If absorption is small in an optical path to a specific NV center, the radiation power density of excitation light can be maximized to six times that of excitation light from the front alone. This can improve the sensitivity of the diamond magneto-optical sensor.

The optical path for excitation light reflected by the plurality of reflecting surfaces to NV center 104 is longer (e.g., by about twice) than an optical path for excitation light directly radiated to NV center 104 without being reflected by the reflecting surfaces. Thus, the optical path for excitation light in diamond magneto-optical sensor 100 can be brought close to the absorption length of diamond, thereby increasing the absorption efficiency (that is, the quantum efficiency of absorption) of excitation light. In other words, since the number of NV centers for excitation increases, the intensity of radiated fluorescence rises. This can improve the sensitivity of the diamond magneto-optical sensor.

Figure 7:
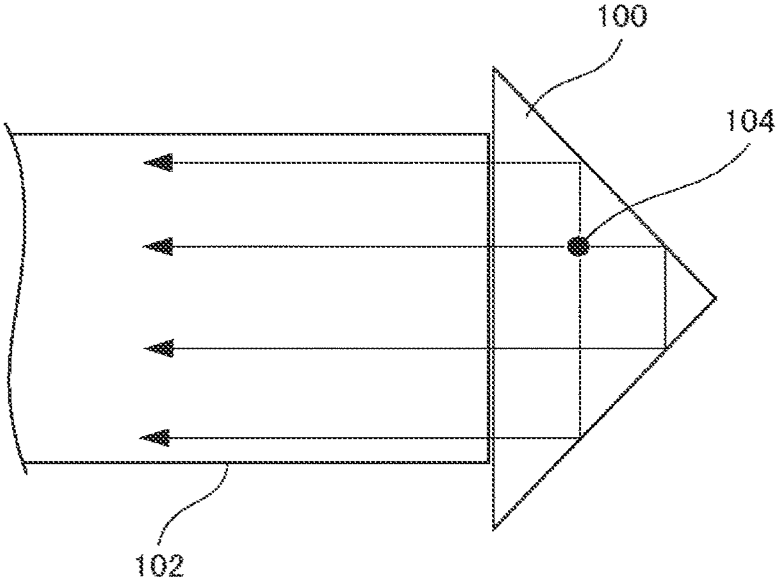
FIG. 7 is a schematic diagram illustrating an optical path for fluorescence radiated from the NV center of the diamond magneto-optical sensor.

FIG. 7 illustrates an optical path for fluorescence radiated from the NV center of diamond magneto-optical sensor 100. Referring to FIG. 7, in diamond magneto-optical sensor 100, NV center 104 irradiated with excitation light radiates fluorescence in all directions (see arrows). From the fluorescence, fluorescence radiated forward (that is, to optical fiber 102) directly enters the end of optical fiber 102 (that is, the output part of excitation light). Fluorescence radiated rearward and in the vertical and horizontal directions is reflected by the plurality of reflecting surfaces (that is, face ABD, face BCD, and face ACD in FIG. 1) in diamond magneto-optical sensor 100, is outputted from diamond magneto-optical sensor 100, and enters the end of optical fiber 102 (that is, the output part of excitation light). In other word, fluorescence radiated in all directions can be condensed forward, thereby increasing the condensing efficiency of fluorescence. Thus, the sensitivity of the diamond magneto-optical sensor can be improved.

Figure 8:
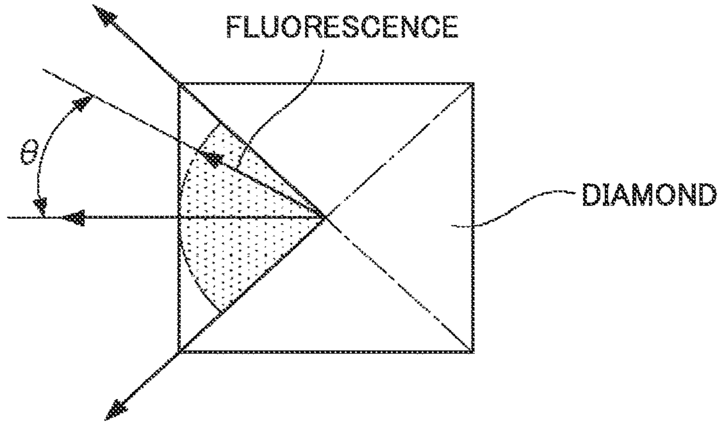
FIG. 8 is a schematic diagram illustrating an optical path for fluorescence radiated from a diamond regardless of a refractive index.

Referring to FIGS. 8 to 11, the effect of increasing the condensing efficiency of fluorescence by diamond magneto-optical sensor 100 will be more specifically described below. FIG. 8 illustrates an optical path for fluorescence radiated from the inside of rectangular (e.g., cubic) diamond. In this configuration, the refractive index of diamond is assumed to be 1, which is not taken into consideration. In this case, light radiated with angle θ(°) in the range of 0≤θ≤45 (that is, a shaded area) with respect to the center axis is outputted from an observation surface (that is, the left surface). Thus, radiated light of 25% (=π/(4π)) can be detected from the ratio of a solid angle.

Figure 9:
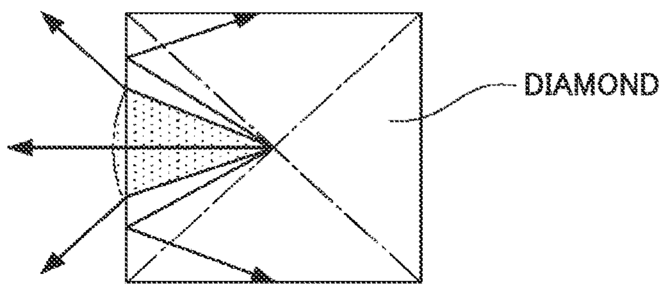
FIG. 9 is a schematic diagram illustrating an optical path for fluorescence radiated from the diamond in consideration of a refractive index.

FIG. 9 illustrates an optical path for fluorescence radiated from the inside of diamond having the same shape as in FIG. 8, in consideration of refractive index n (that is, about 2.5) of diamond. In this case, light radiated with angle θ(°) in the range of 0≤θ≤17 (that is, a shaded area) with respect to the center axis is outputted from an observation surface (the left surface). Light of θ>17 exceeds a critical angle and thus is reflected on the left surface. Thus, unlike in FIG. 8, radiated light of only about 2.3% ($=0.3^2\pi/(4\pi)$) can be actually detected from the ratio of a solid angle.

Figure 10:
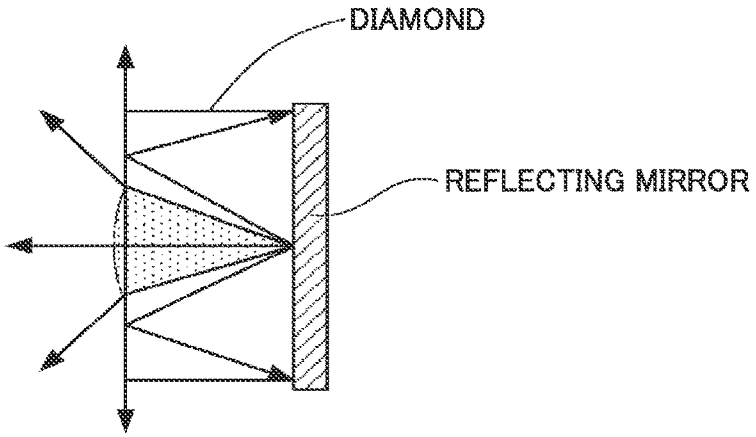
FIG. 10 is a schematic diagram illustrating an optical path for fluorescence radiated from the diamond when a reflecting mirror is provided.

FIG. 10 illustrates an optical path for fluorescence radiated from the inside of diamond with a reflecting mirror disposed on one surface of diamond, in consideration of refractive index n of diamond as in FIG. 9. For convenience, the size of diamond is a half that of FIG. 9 in the vertical direction with respect to the observation surface. In this case, as in FIG. 9, light radiated with angle θ(°) in the range of 0≤θ≤17 (that is, a shaded area) with respect to the center axis is outputted from an observation surface (that is, the left surface). Furthermore, light radiated rearward in the same angle range is reflected forward by the reflecting mirror and is outputted in the same angle range from the observation surface. Thus, light nearly doubled from that of FIG. 9 is outputted from the observation surface (that is, the left surface). Radiated light of about 4.5% ($=(0.3^2\pi)\times2/(4\pi)$) can be detected from the ratio of a solid angle.

Figure 11:
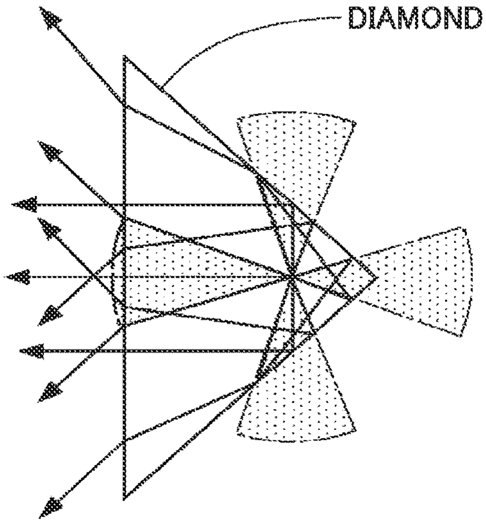
FIG. 11 is a schematic diagram illustrating an optical path for fluorescence radiated from a diamond shaped like a corner cube.

FIG. 11 illustrates an optical path for fluorescence radiated from the inside of diamond of a corner cube, in consideration of refractive index n of diamond. In this case, as in FIG. 9, light radiated with angle θ(°) in the range of 0≤θ≤17 (that is, a shaded area) with respect to the center axis is outputted from an observation surface (that is, the left surface). Furthermore, light radiated rearward and laterally in the same angle range (that is, shaded areas) is reflected forward and is outputted from an observation surface while surfaces other than the observation surface of the corner cube act as reflecting surfaces. Radiated light of about 35% ($=((0.3^2\pi)\times2+0.6\times2\pi)/(4\pi)$) can be detected from the ratio of a solid angle.

As described above, about 2.3% of fluorescence radiated forward from the NV center can be observed in the flat diamond in FIG. 9. Even if the reflecting surfaces are provided, only about 4.5% of fluorescence can be observed. In contrast, by using diamond of a corner cube, fluorescence radiated laterally and rearward from the NV center can be also condensed, achieving observation of about 35% of fluorescence. As compared with flat diamond, the condensing efficiency is increased by about 15 times.

Thus, diamond magneto-optical sensor 100 can improve the condensing efficiency of fluorescence and the absorption efficiency and power density of excitation light. Thus, the diamond magneto-optical sensor can be obtained with higher responsivity and sensitivity.

(First Modification)

In the foregoing description, the diamond magneto-optical sensor is formed from a diamond. The configuration is not limited thereto. Members other than diamond may be included. A diamond magneto-optical sensor according to a first modification includes members other than a diamond.

Figure 12:
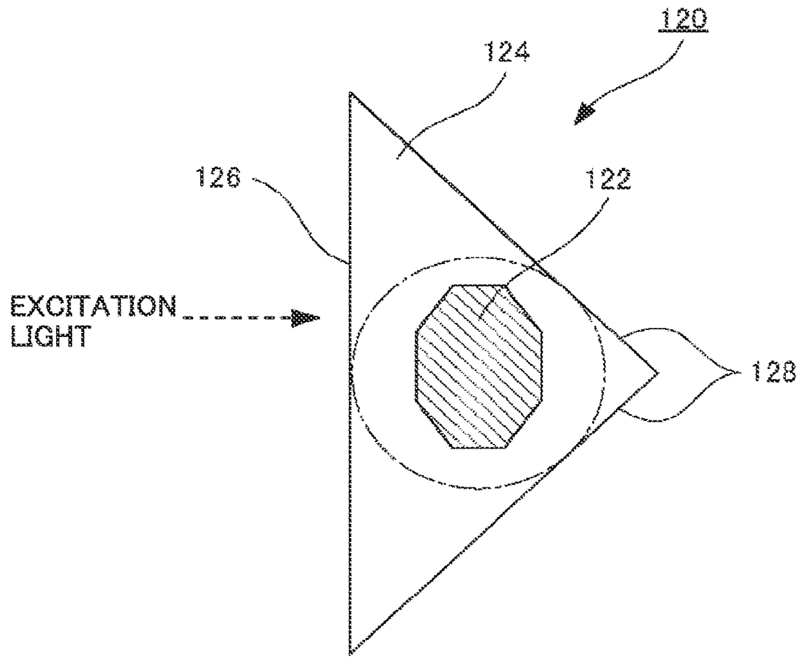
FIG. 12 is a cross-sectional view illustrating the configuration of a diamond magneto-optical sensor according to a first modification.

Referring to FIG. 12, a diamond magneto-optical sensor 120 includes a diamond 122 including an NV center and a glass 124 containing diamond 122. Glass 124 is identical in shape to diamond magneto-optical sensor 100 (e.g., a corner cube) in FIG. 3. Conditions about the dimensions of the sides (that is, a, b, and c in FIG. 3) and angles (that is, α, β, and γ in FIG. 3) of glass 124 may be identical to those of diamond magneto-optical sensor 100. As described above, in FIG. 12, excitation light incident on an entrance surface 126 is reflected by a reflecting surface 128 in diamond magneto-optical sensor 120 and is concentrated inside a chain line (hereinafter referred to as excitation light increasing area). Thus, diamond 122 only needs to be sized such that at least a part of diamond 122 is present in the excitation light increasing area. Diamond 122 may have any shape. Glass 124 formed around the diamond can reduce the amount of diamond, achieving cost-cutting of the diamond magneto-optical sensor. Moreover, the glass only needs to be cut into a corner cube, facilitating the manufacturing of the diamond magneto-optical sensor as compared with cutting on diamond.

As described above, fluorescence radiated from the NV center of diamond 122 is reflected by reflecting surface 128 and is outputted from entrance surface 126. The member containing diamond 122 is not limited to glass. Any members may be used if the transmittances of green light (that is, a wavelength of about 490 to 560 nm) and red light (that is, a wavelength from about 630 to 800 nm) are high. The member may be made of resin. Since the refractive index of glass 124 is lower than that of diamond, reflecting surface 128 is preferably surface-machined and provided with a mirror (e.g., metallic coating or metallization).

(Second Modification)

In the foregoing description, the reflecting surface is flat. The configuration is not limited thereto. A diamond magneto-optical sensor according to a second modification has a curved reflecting surface.

Figure 13:
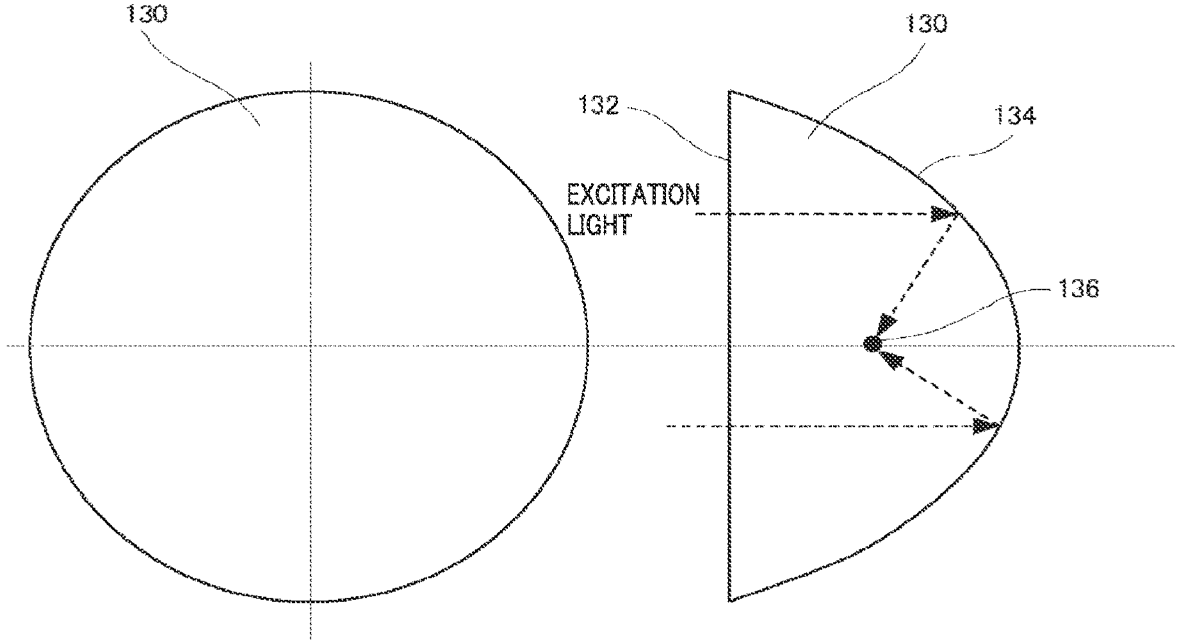
FIG. 13 is a two-view drawing illustrating the configuration of a diamond magneto-optical sensor according to a second modification.

Referring to FIG. 13, a diamond magneto-optical sensor 130 includes an NV center and has a flat entrance surface 132 and a curved reflecting surface 134. Excitation light is emitted to entrance surface 132. Reflecting surface 134 is, for example, a curved surface for having a focal point 136 of a paraboloid or an ellipsoidal surface or the like. Reflecting surface 134 only needs to have a concave shape when viewed from entrance surface 132. If reflecting surface 134 has a concave shape, excitation light emitted to diamond magneto-optical sensor 130 from entrance surface 132 is reflected forward (that is, to entrance surface 132) by reflecting surface 134 in diamond magneto-optical sensor 130. This can extend an optical path for excitation light and increase the absorption efficiency of excitation light at the NV center. Fluorescence radiated from the NV center is reflected forward (that is, to entrance surface 132) by reflecting surface 134 and is condensed in diamond magneto-optical sensor 130, and then the fluorescence is outputted from entrance surface 132. This can increase the condensing efficiency of fluorescence.

Figure 14:
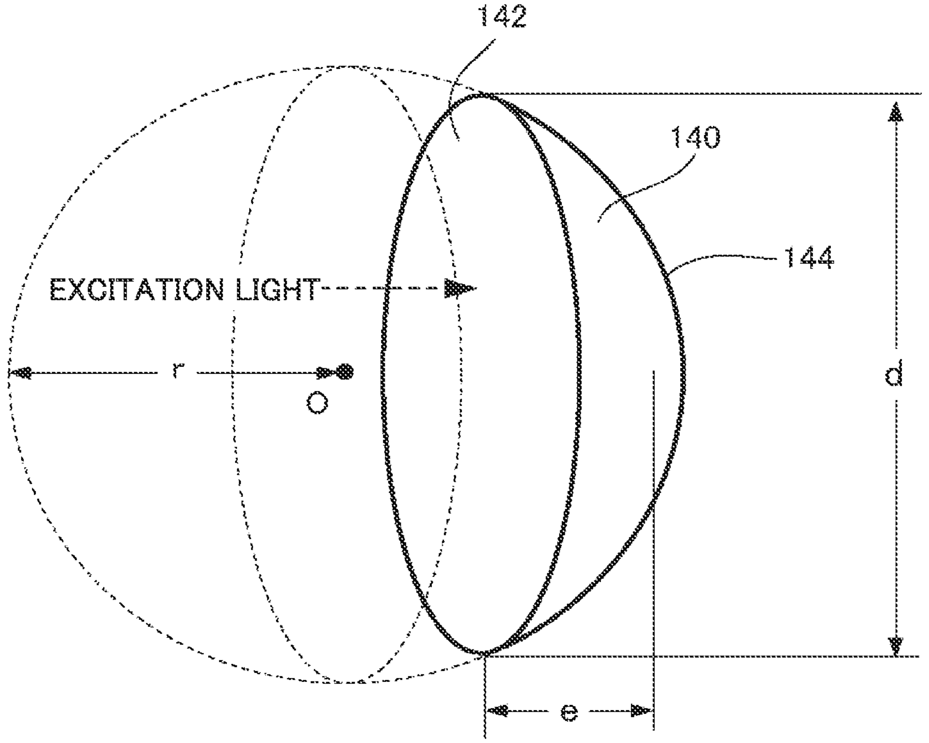
FIG. 14 is a perspective view illustrating the configuration of a diamond magneto-optical sensor, which is different from FIG. 13, according to the second modification.

Furthermore, the reflecting surface of the diamond magneto-optical sensor may be a spherical surface. Referring to FIG. 14, a diamond magneto-optical sensor 140 includes an NV center and has a flat entrance surface 142 and a curved reflecting surface 144. Diamond magneto-optical sensor 140 is a spherical segment obtained by cutting a sphere, which has a radius r, at a plane that does not pass through a center o of the sphere. The spherical segment does not include center o. Reflecting surface 144 is a part of a cut spherical surface (that is, a spherical crown). Excitation light enters diamond magneto-optical sensor 140 from entrance surface 142. Excitation light emitted to diamond magneto-optical sensor 140 is reflected forward (that is, to the entrance surface 142) by reflecting surface 144 in diamond magneto-optical sensor 140. This can extend an optical path for excitation light and increase the absorption efficiency of excitation light at the NV center. Fluorescence radiated from the NV center is reflected forward (that is, to entrance surface 142) by reflecting surface 144 and is condensed in diamond magneto-optical sensor 140, and then the fluorescence is outputted from entrance surface 142. This can increase the condensing efficiency of fluorescence. Lengths d and e in FIG. 14 are preferably expressed as r>d>3r/4 and 3r/2>e>r/2. Length d is the diameter of entrance surface 142, and length e is the height of the spherical segment (that is, the maximum value of a vertical distance from entrance surface 142 to the spherical segment).

The diamond magneto-optical sensor according to the second modification may be formed to include a diamond including an NV center and a glass containing the diamond as in the first modification. In this case, the glass containing the diamond is shaped as illustrated in FIG. 13 or 14.

(Third Modification)

In the foregoing description, the entrance surface of excitation light is flat. The configuration is not limited thereto. A diamond magneto-optical sensor according to a third modification has a curved entrance surface.

Figure 15:
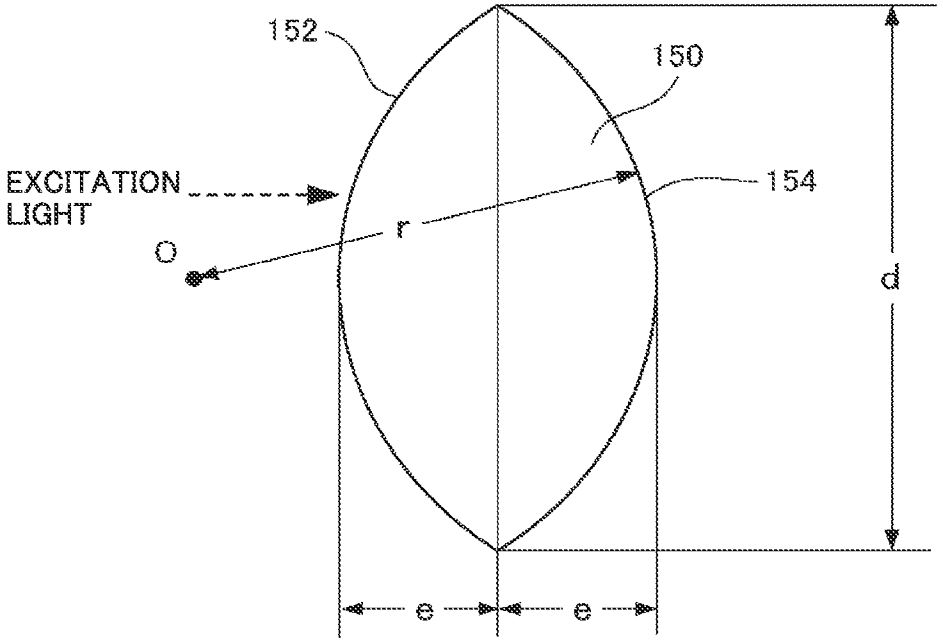
FIG. 15 is a side view illustrating the configuration of a diamond magneto-optical sensor according to a third modification.

Referring to FIG. 15, a diamond magneto-optical sensor 150 includes an NV center and has a curved entrance surface 152 and a curved reflecting surface 154. Entrance surface 152 and reflecting surface 154 are both spherical crowns. Diamond magneto-optical sensor 150 is shaped such that two spherical segments are bonded to each other on the flat surfaces. Excitation light enters diamond magneto-optical sensor 150 from entrance surface 152. Excitation light emitted to diamond magneto-optical sensor 150 is reflected forward (that is, to entrance surface 152) by reflecting surface 154 in diamond magneto-optical sensor 150. This can extend an optical path for excitation light and increase the absorption efficiency of excitation light at the NV center. Fluorescence radiated from the NV center is reflected forward (that is, to entrance surface 152) by reflecting surface 154 and is condensed in diamond magneto-optical sensor 150, and then the fluorescence is outputted from entrance surface 152. This can increase the condensing efficiency of fluorescence.

If reflecting surface 154 is formed by two spherical segments obtained by cutting a sphere with a radius r as illustrated in FIG. 14, lengths d and e in FIG. 15 are preferably expressed as r>d>3r/4 and 3r/2>e>r/2. In the case of diamond magneto-optical sensor 150 having such a shape, if excitation light enters entrance surface 152 in parallel with an axis perpendicular to the bonded surface of entrance surface 152 and reflecting surface 154, excitation light can be condensed in diamond magneto-optical sensor 150.

The diamond magneto-optical sensor according to the third modification may be formed to include a diamond including an NV center and a glass containing the diamond as in the first modification. In this case, the glass containing the diamond is shaped as illustrated in FIG. 15.

(Fourth Modification)

In the foregoing description, the diamond magneto-optical sensor is a tetrahedron. The shape is not limited thereto. The diamond magneto-optical sensor according to a fourth modification is a polyhedron having five faces or more.

Figure 16:
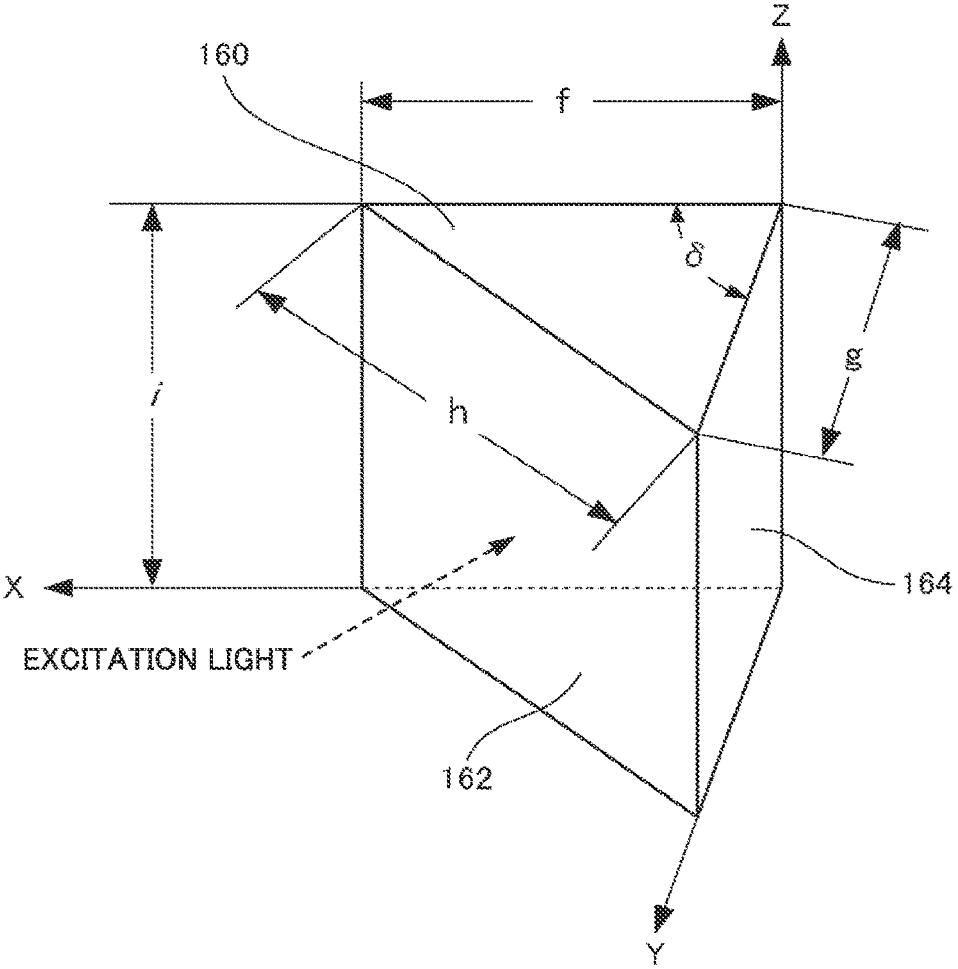
FIG. 16 is a perspective view illustrating the configuration of a diamond magneto-optical sensor according to a fourth modification.

Referring to FIG. 16, a diamond magneto-optical sensor 160 includes an NV center, is shaped like a triangular pole (that is, a pentahedron), and has an entrance surface 162 and four reflecting surfaces (that is, including a reflecting surface 164) other than entrance surface 162. Excitation light enters diamond magneto-optical sensor 160 from entrance surface 162. Excitation light emitted to diamond magneto-optical sensor 160 is reflected forward (that is, to entrance surface 162) by the plurality of reflecting surfaces including reflecting surface 164 in diamond magneto-optical sensor 160. This can extend an optical path for excitation light and increase the absorption efficiency of excitation light at the NV center. Fluorescence radiated from the NV center is reflected forward (that is, to entrance surface 162) by the plurality of reflecting surfaces including reflecting surface 164 and is condensed in diamond magneto-optical sensor 160, and then the fluorescence is outputted from entrance surface 162. This can increase the condensing efficiency of fluorescence.

If a magnetic field is measured by using diamond magneto-optical sensor 160, an angle δ in FIG. 16 is preferably 90°. Entrance surface 162 preferably has a square shape, that is, has two intersecting sides with equal lengths h and i. Lengths f, g, h, and i preferably satisfy the following relationships:

$$g \times (1/1.4 - 0.5) \le f \le g \times (1/1.4 + 0.5)$$

$$h \times (1/1.4 - 0.5) \le f \le h \times (1/1.4 + 0.5)$$

$$i \times (1/1.4 - 0.5) \le f \le i \times (1/1.4 + 0.5)$$

The diamond magneto-optical sensor may be a polyhedron having six faces or more. The curved reflecting surfaces in FIGS. 13 and 14 may be transformed close to a plurality of flat surfaces of a polyhedron.

The diamond magneto-optical sensor according to the fourth modification may be formed to include a diamond including an NV center and a glass containing the diamond as in the first modification. In this case, the glass containing the diamond is shaped like a polyhedron having five faces or more (for example, the triangular pole in FIG. 16).

(Fifth Modification)

In the foregoing description, fluorescence outputted from the entrance surface of excitation light is detected (that is, the incident direction of excitation light into the diamond magneto-optical sensor and the output direction of fluorescence from the diamond magneto-optical sensor are opposite to each other) in the diamond magneto-optical sensor. The configuration is not limited thereto. In a diamond magneto-optical sensor according to a fifth modification, the incident direction of excitation light and the output direction of fluorescence agree with each other and fluorescence outputted from a surface different from the entrance surface of excitation light is detected.

Figure 17:
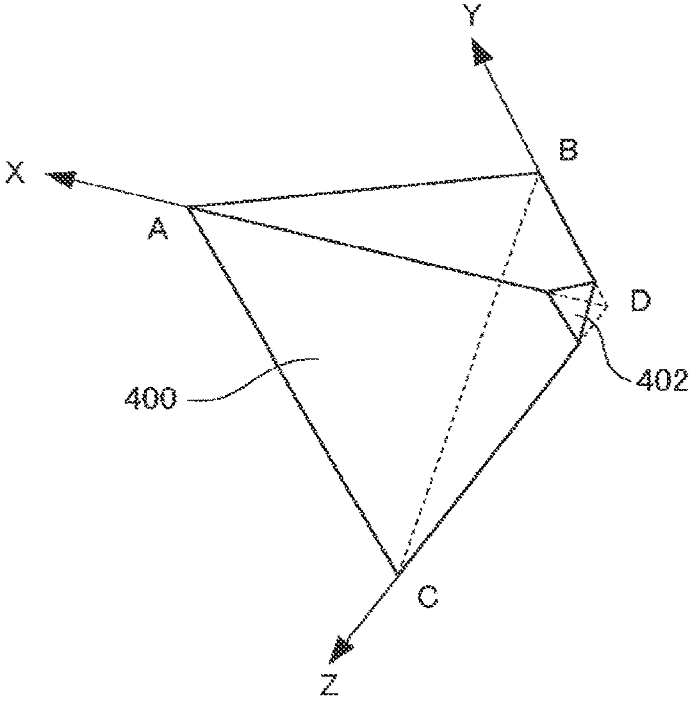
FIG. 17 is a perspective view illustrating the configuration of a diamond magneto-optical sensor according to a fifth modification.

Referring to FIG. 17, a diamond magneto-optical sensor 400 according to the fifth modification is formed to include a diamond including an NV center and is substantially shaped like a triangular pyramid with a small flat portion 402 (specifically, a triangular frustum). For example, diamond magneto-optical sensor 400 can be formed by cutting a portion including apex D along a predetermined plane in diamond magneto-optical sensor 100 illustrated in FIG. 3.

Figure 18:
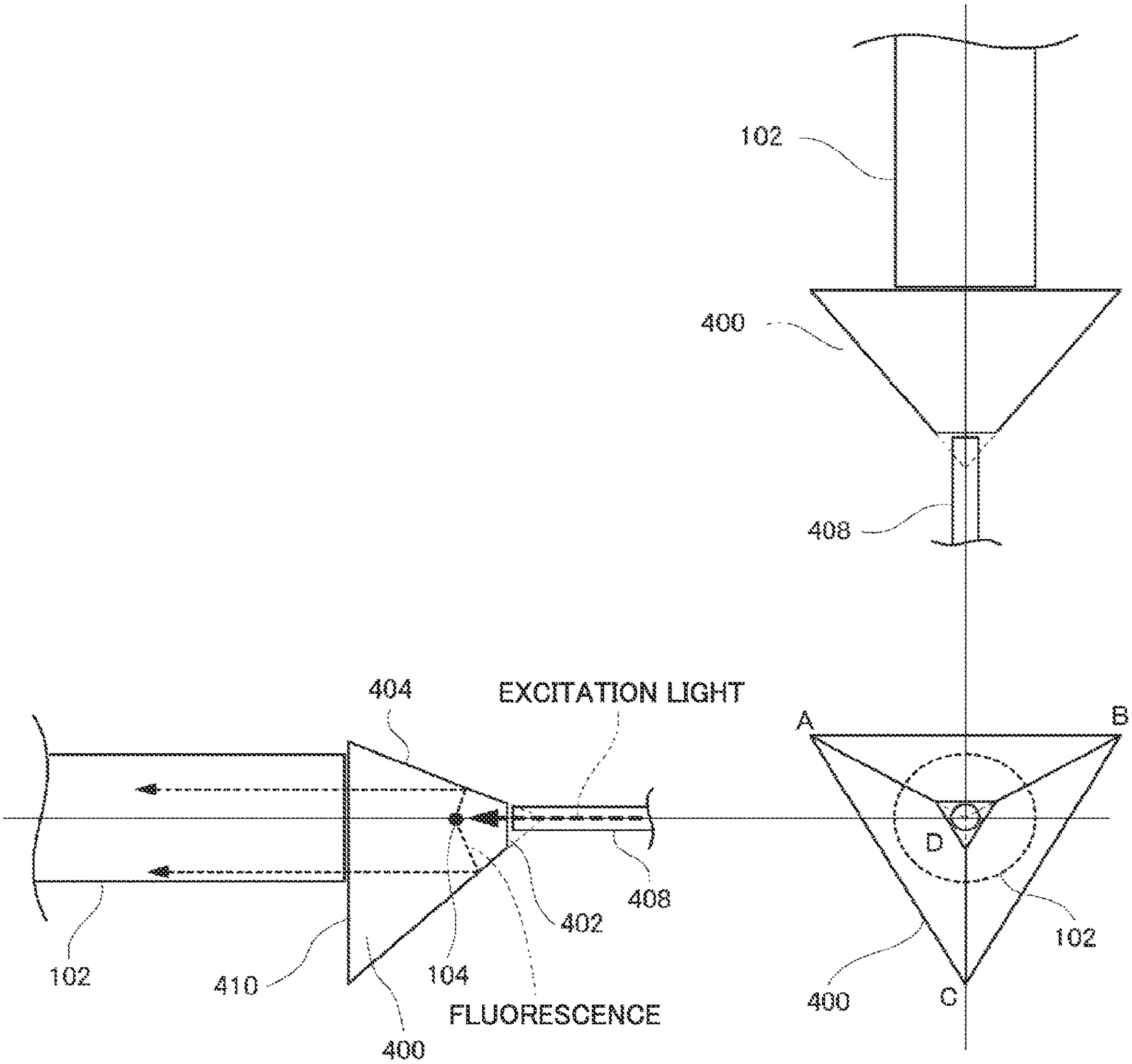
FIG. 18 is a three-view drawing illustrating the layout of the diamond magneto-optical sensor in FIG. 17 and an optical fiber.

Referring to FIG. 18, excitation light is emitted to diamond magneto-optical sensor 400 by irradiation to small portion 402 through an optical fiber 408. For example, excitation light is vertically emitted to the surface of small portion 402 from optical fiber 408. Thus, excitation light emitted from optical fiber 408 enters diamond magneto-optical sensor 400 from small portion 402. Fluorescence is radiated from NV center 104 by excitation light having entered diamond magneto-optical sensor 400. The radiated fluorescence is reflected by a reflecting surface 404, is outputted from an output surface 410, and enters optical fiber 102. The fluorescence having entered optical fiber 102 is transmitted to a detector through optical fiber 102.

Small portion 402 having a smaller area than reflecting surface 404 only needs to satisfy optical conditions of incidence on diamond magneto-optical sensor 400 and may have a nonflat surface as will be described later. Small portion 402 preferably has a size of sub μm or more so as to be irradiated with a laser beam (that is, excitation light). Moreover, small portion 402 is preferably located such that radiated light (that is, fluorescence) from the NV center by excitation light having entered diamond magneto-optical sensor 400 can be reflected by the reflecting surface and condensed toward an optical system that receives the radiated light. Condensing means the function of concentrating light with an increased angle to a desired direction.

Figure 19:
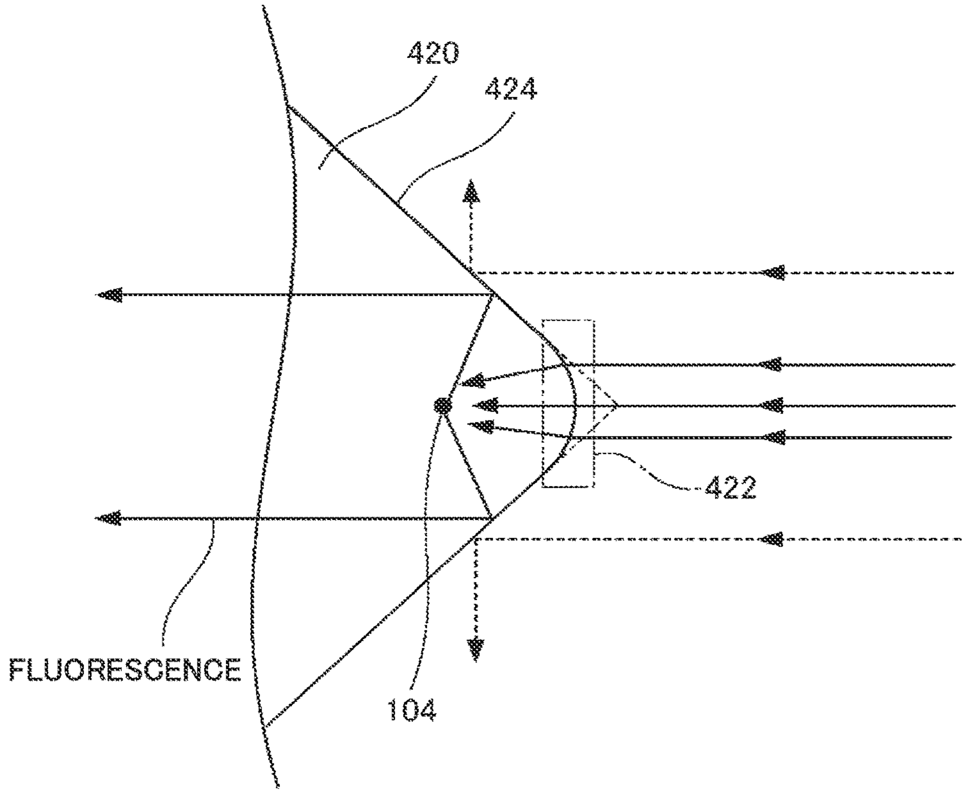
FIG. 19 is a cross-sectional view illustrating a diamond magneto-optical sensor that is different from the diamond magneto-optical sensor in FIG. 17 in the shape of the distal end portion.

In the foregoing description, small portion 402 for receiving excitation light is flat. The configuration is not limited thereto. Referring to FIG. 19, a diamond magneto-optical sensor 420 includes a small portion 422 and a reflecting surface 424. Reflecting surface 424 is substantially a triangular pyramid like reflecting surface 404. The shape of small portion 422 is a smoothly curved surface instead of a flat surface. Thus, as indicated by solid-line arrows, excitation light incident on small portion 422 mainly enters magneto-optical sensor 420. As indicated by broken-line arrows, light incident on portions other than small portion 422 (that is, reflecting surface 424) is mainly reflected to the outside of diamond magneto-optical sensor 420. Thus, the small portion may have a nonflat surface if excitation light is allowed to enter diamond magneto-optical sensor 420. Fluorescence radiated from NV center 104 by excitation light having entered diamond magneto-optical sensor 420 is reflected by reflecting surface 424 and is outputted from the side opposite to the incident side of excitation light (Sixth Modification)

Figure 20:
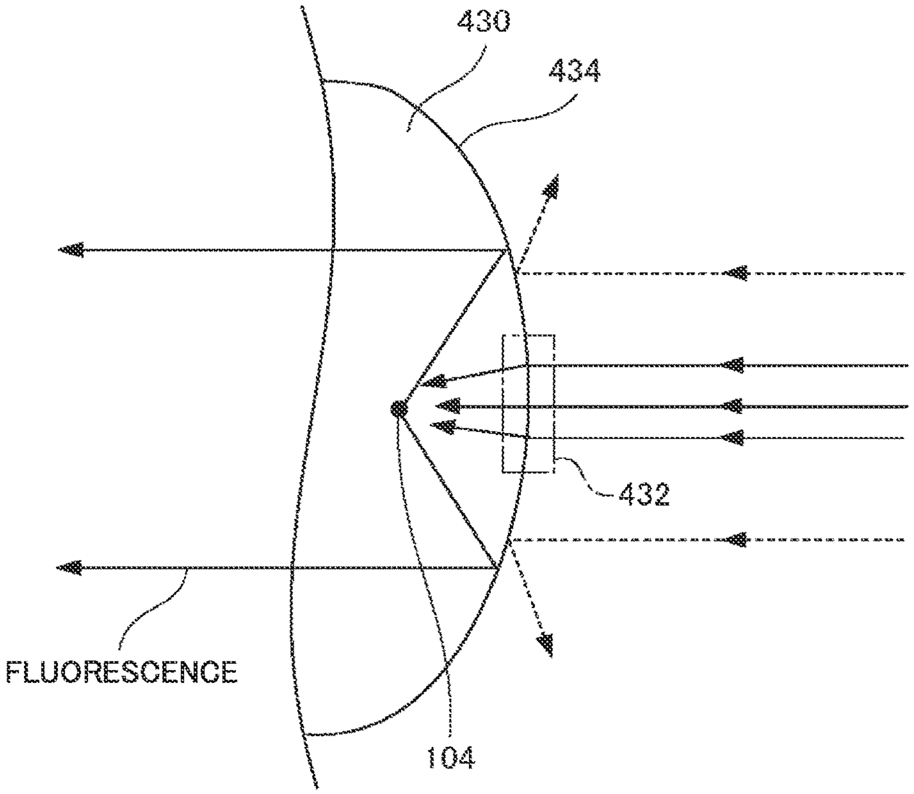
FIG. 20 is a perspective view illustrating the configuration of a diamond magneto-optical sensor according to a sixth modification.

In the fifth modification, the diamond magneto-optical sensor including the NV center is shaped like a triangular pyramid with a small portion. The configuration is not limited thereto. Referring to FIG. 20, a diamond magneto-optical sensor 430 according to a sixth modification includes a small portion 432 and a reflecting surface 434. Small portion 432 and reflecting surface 434 are entirely formed with a smoothly curved surface. Thus, as indicated by solid-line arrows, excitation light incident on small portion 432 mainly enters diamond magneto-optical sensor 430. As indicated by broken-line arrows, light incident on portions other than small portion 432 (that is, reflecting surface 434) is mainly reflected to the outside of diamond magneto-optical sensor 430. Fluorescence radiated from NV center 104 by excitation light having entered diamond magneto-optical sensor 430 is reflected by reflecting surface 434 and is outputted from the side opposite to the incident side of excitation light.

Figure 21:
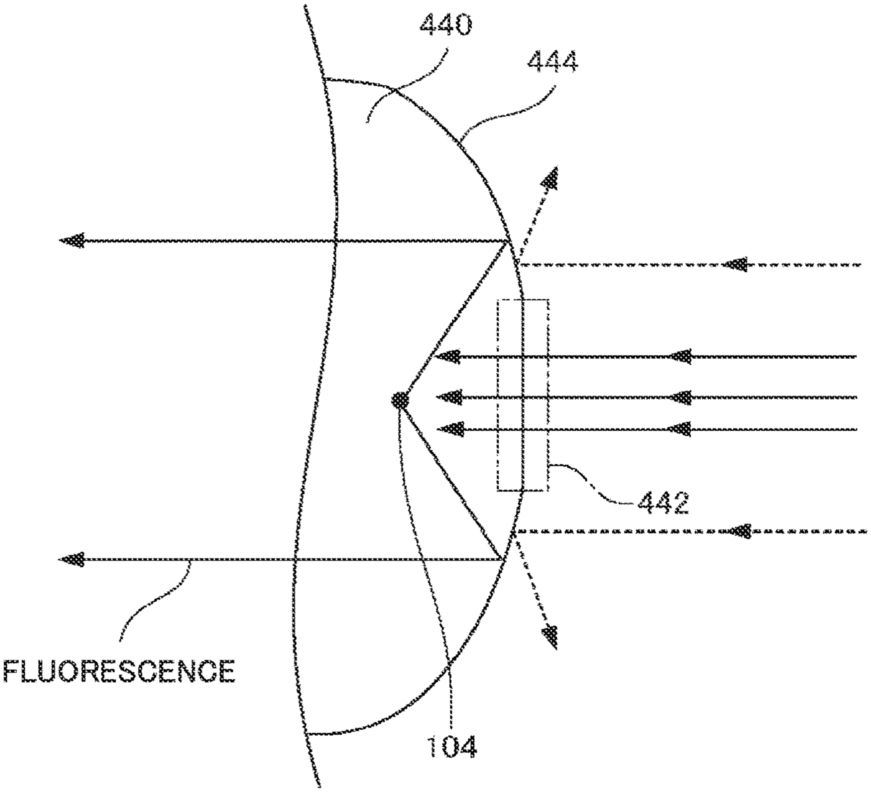
FIG. 21 is a cross-sectional view illustrating a diamond magneto-optical sensor that is different from the diamond magneto-optical sensor in FIG. 20 in the shape of the distal end portion.

As in the fifth modification, the small portion may be flat. Referring to FIG. 21, a diamond magneto-optical sensor 440 includes a small portion 442 and a reflecting surface 444. Reflecting surface 444 is a smoothly curved surface, and small portion 442 has a flat surface. Optical paths for excitation light and fluorescence are extended as in FIG. 20.

(Seventh Modification)

Figure 22:
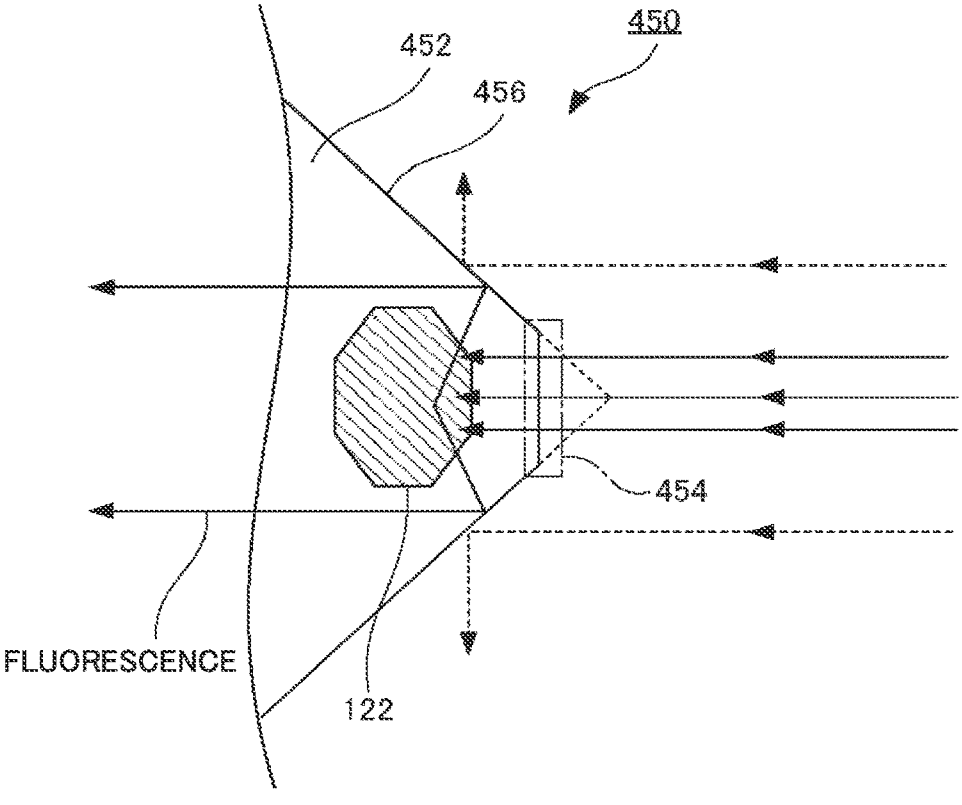
FIG. 22 is a perspective view illustrating the configuration of a diamond magneto-optical sensor according to a seventh modification.

In the fifth and sixth modifications, the diamond magneto-optical sensor is entirely made of diamond. The configuration is not limited thereto. Referring to FIG. 22, a diamond magneto-optical sensor 450 according to a seventh modification includes a glass 452 with a small portion 454 and a reflecting surface 456 and diamond 122. As in FIG. 12, diamond magneto-optical sensor 450 is configured such that glass 452 contains diamond 122 including an NV center. Glass 452 is identical in shape to diamond magneto-optical sensor 400 (that is, a triangular frustum) in FIGS. 17 and 18. Thus, as indicated by solid-line arrows, excitation light incident on small portion 454 mainly enters glass 452 and diamond 122. As indicated by broken-line arrows, light incident on portions other than small portion 454 (that is, reflecting surface 456) is mainly reflected to the outside of glass 452 and thus is not emitted to diamond 122. Fluorescence radiated from the NV center of diamond 122 by excitation light having entered glass 452 is reflected by reflecting surface 456 and is outputted from the side opposite to the incident side of excitation light.

Figure 23:
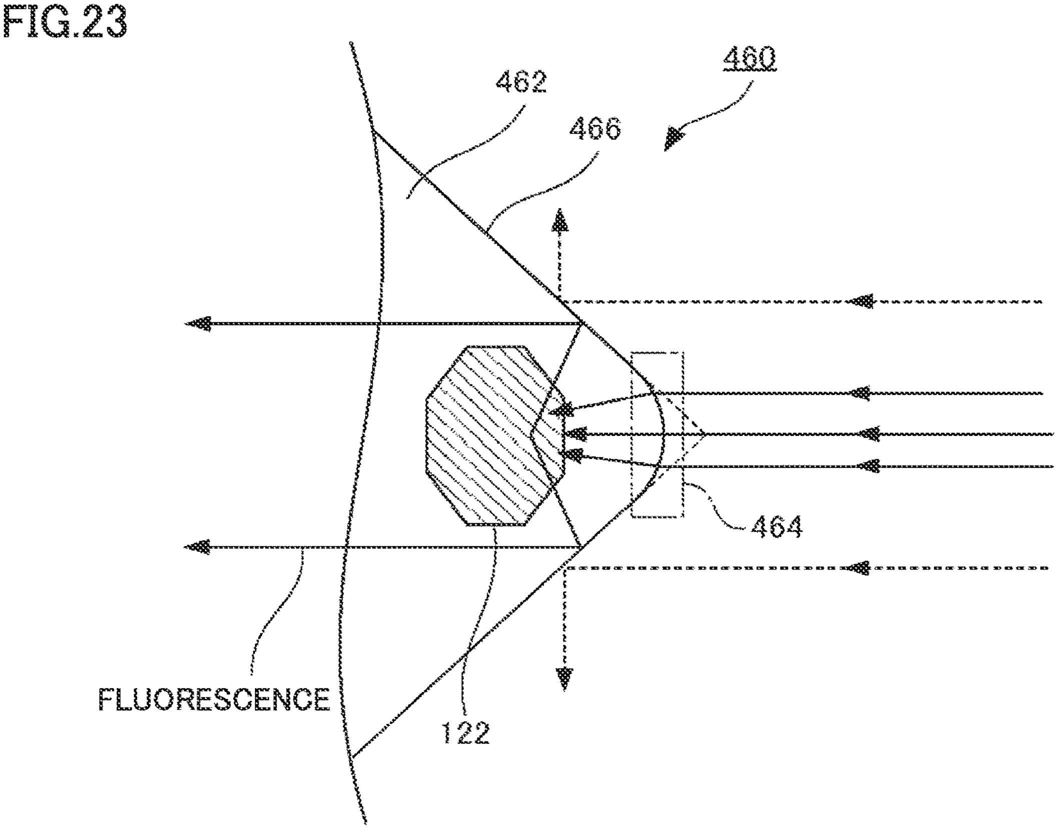
FIG. 23 is a cross-sectional view illustrating a diamond magneto-optical sensor that is different from the diamond magneto-optical sensor in FIG. 22 in the shape of the distal end portion.

The small portion formed on the glass may have a nonflat surface. Referring to FIG. 23, a diamond magneto-optical sensor 460 includes a glass 462 with a small portion 464 and a reflecting surface 466 and diamond 122. Glass 462 contains diamond 122 including an NV center. Glass 462 is identical in shape to diamond magneto-optical sensor 420 in FIG. 19. Specifically, small portion 464 is a smoothly curved surface instead of a flat surface. Optical paths for excitation light and fluorescence are extended as in FIG. 22.

As described above, diamond 122 only needs to be sized such that at least a part of diamond 122 is present in the excitation light increasing area (that is, inside a chain line in FIG. 12). Diamond 122 may have any shape. Glass formed around the diamond can reduce the amount of diamond, achieving cost-cutting of the diamond magneto-optical sensor. Moreover, the glass only needs to be cut, facilitating the manufacturing of the diamond magneto-optical sensor as compared with cutting on diamond.

(Eighth Modification)

Figure 24:
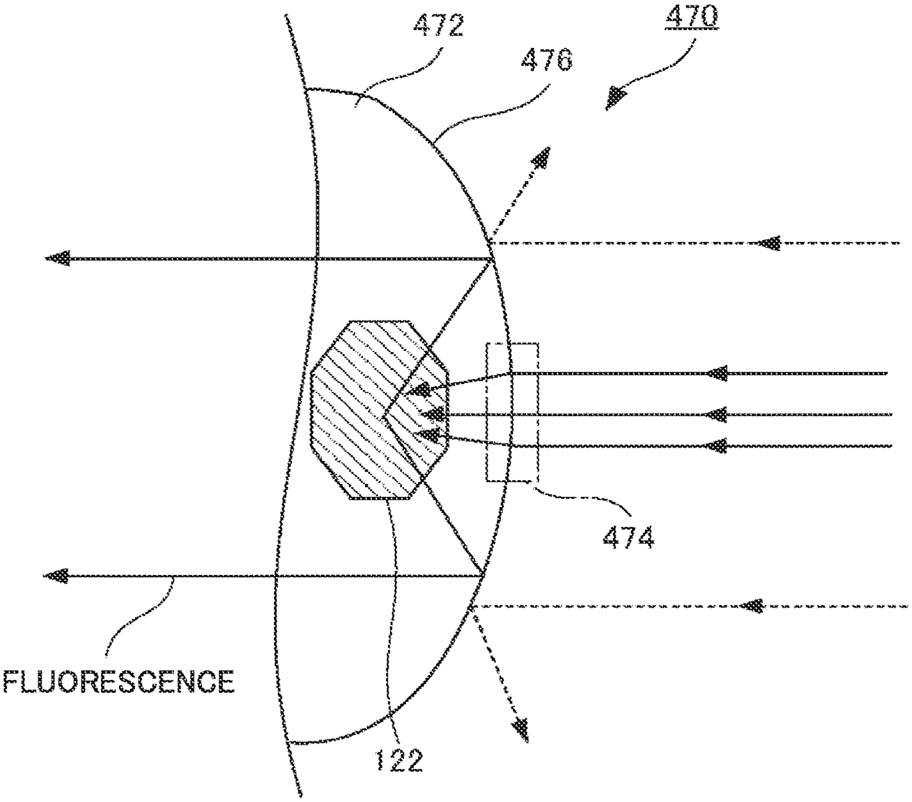
FIG. 24 is a perspective view illustrating the configuration of a diamond magneto-optical sensor according to an eighth modification.

The shape of the glass containing the diamond is not limited to the foregoing shape. Referring to FIG. 24, a diamond magneto-optical sensor 470 according to an eighth modification includes a glass 472 with a small portion 474 and a reflecting surface 476 and diamond 122. Glass 472 contains diamond 122 including an NV center. Glass 472 is identical in shape to diamond magneto-optical sensor 430 in FIG. 20. Specifically, small portion 474 and reflecting surface 476 of glass 472 are entirely formed with a smoothly curved surface. Thus, as indicated by solid-line arrows, excitation light incident on small portion 474 mainly enters glass 472 and diamond 122. As indicated by broken-line arrows, light incident on portions other than small portion 474 (that is, reflecting surface 476) is mainly reflected to the outside of glass 472 and thus is not emitted to diamond 122. Fluorescence radiated from the NV center of diamond 122 by excitation light having entered glass 472 is reflected by reflecting surface 476 and is outputted from the side opposite to the incident side of excitation light.

Figure 25:
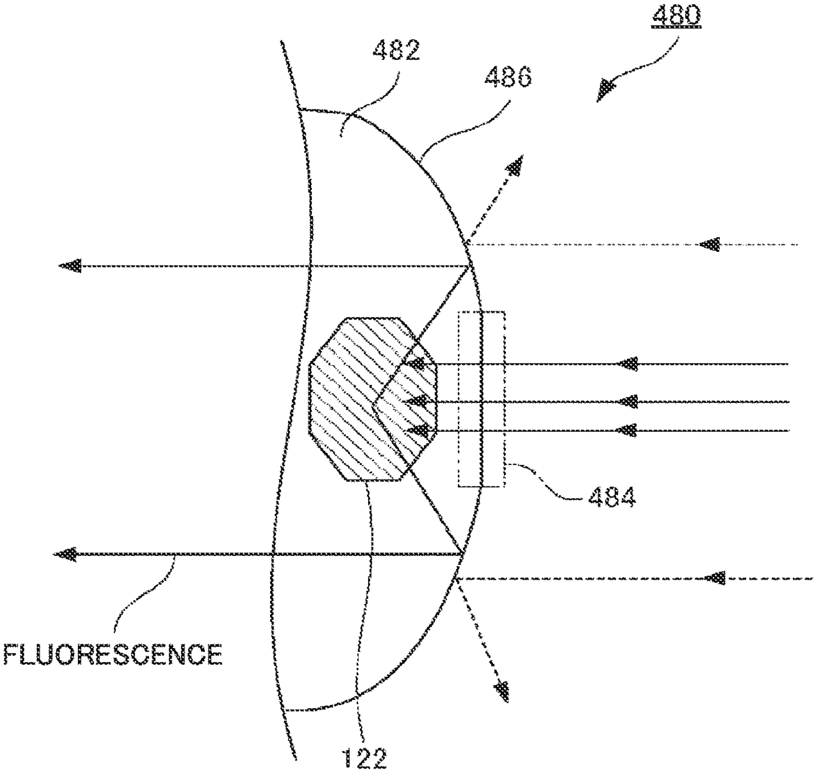
FIG. 25 is a cross-sectional view illustrating a diamond magneto-optical sensor that is different from the diamond magneto-optical sensor in FIG. 24 in the shape of the distal end portion.

The small portion of the glass may be flat. Referring to FIG. 25, a diamond magneto-optical sensor 480 includes a glass 482 with a small portion 484 and a reflecting surface 486 and diamond 122. Glass 482 contains diamond 122 including an NV center. Glass 482 is identical in shape to diamond magneto-optical sensor 440 in FIG. 21. Glass 482 is a smoothly curved surface, and small portion 484 is a flat surface. Optical paths for excitation light and fluorescence are extended as in FIG. 24.

The glass is preferably quartz glass in view of the transmittance of light, workability, and ease of handling. More preferably, the glass is a material that can transmit 90% or more of excitation light and fluorescence and has a high refractive index. This is because a critical angle for total reflection increases on a glass reflecting surface (e.g., reflecting surface 456 in FIG. 22) and a larger amount of fluorescence is condensed. Moreover, this is because internal reflection decreases at an interface surface between glass and diamond (e.g., an interface surface between glass 452 and diamond 122 in FIG. 22) and facilitates the entry of light (that is, excitation light) into the diamond.

A sensor unit can be formed by using the diamond magneto-optical sensor. Specifically, as described above, the sensor unit includes a diamond magneto-optical sensor including an NV center, an irradiation unit that irradiates the diamond magneto-optical sensor with excitation light, a detection unit that detects radiated light from the NV center of the diamond magneto-optical sensor, and an optical waveguide that transmits excitation light and radiated light. Thus, the sensor unit with high responsivity and sensitivity can be achieved.

In the foregoing description, the diamond magneto-optical sensor includes the NV center. The configuration is not limited thereto. The diamond magneto-optical sensor only needs to include a color center with an electronic spin. The color center with the electronic spin is a center that forms a spin triplet state and is illuminated by excitation. A typical example is the color center is an NV center. Additionally, it is known that a color center with an electronic spin is also present in a silicon-vacancy center (that is, Si—V center), a germanium-vacancy center (that is, Ge—V center), and a tin-vacancy center (that is, Sn—V center). Thus, the diamond magneto-optical sensor may be formed by using diamonds including such centers instead of a diamond including an NV center.

Figure 26:
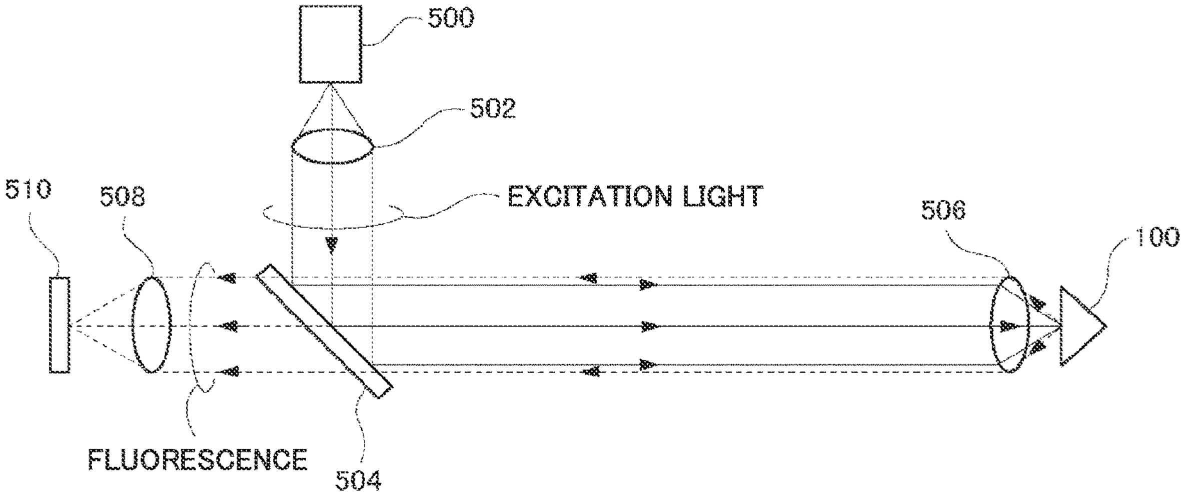
FIG. 26 is a schematic diagram illustrating an example of a configuration for spatially transmitting excitation light and fluorescence.

In the foregoing description, excitation light and fluorescence are transmitted to the diamond magneto-optical sensor through the optical fiber. The configuration is not limited thereto. Excitation light and fluorescence may be spatially transmitted. For example, referring to FIG. 26, excitation light outputted from a light source 500 can be transformed into parallel rays through a collimate lens 502, can be reflected by a dichroic mirror 504, can be condensed through a collimate lens 506, and can be emitted to diamond magneto-optical sensor 100. Fluorescence outputted from the NV center of diamond magneto-optical sensor 100 is transformed into parallel rays through collimate lens 506. The parallel rays pass through dichroic mirror 504, are condensed through a collimate lens 508, and are detected by a photodetector 510.

Example 1

The effectiveness of the present disclosure will be described below according to an example. For the diamond magneto-optical sensor, an element cut in the shape of a corner cube in FIG. 3 and a flat-shaped element as a comparative example were used.

A diamond of type Ib was used. Electrons were injected into the diamond with an electron acceleration energy of 3 MeV and an electron dose of $3\times10^{18}/cm^2$, and then the diamond was annealed at 800° C. for about one hour, so that the diamond including an NV center was generated. The diamond was cut into a corner cube with an oblique side of 1 mm to produce a diamond magneto-optical sensor. Moreover, the diamond was cut into a cube with a side of 1 mm to produce a diamond magneto-optical sensor as a comparative example.

Figure 27:
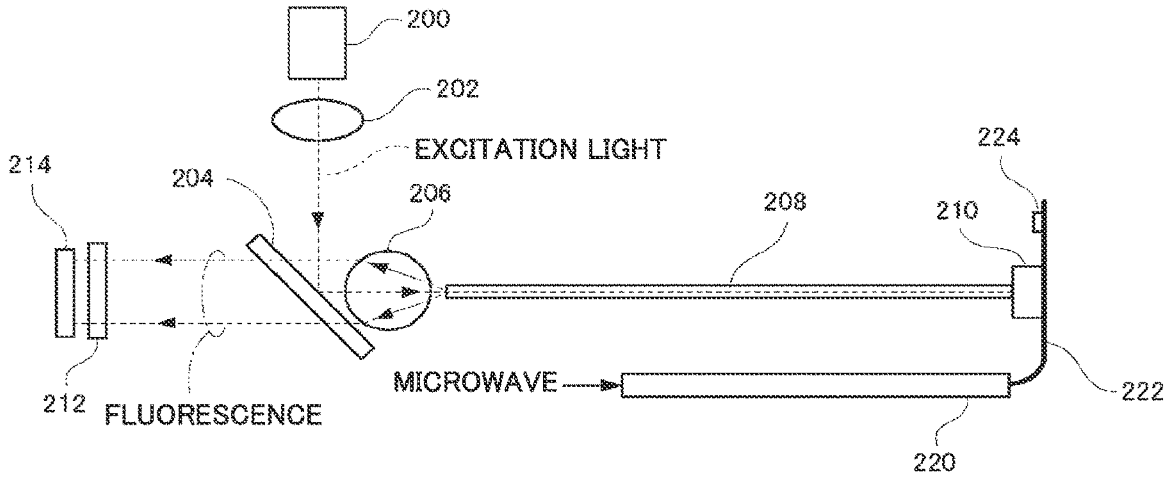
FIG. 27 is a schematic diagram illustrating the configuration of Example 1.

By using a measuring device configured as illustrated in FIG. 27, the diamond magneto-optical sensor including the NV center was irradiated with excitation light, and the intensity of fluorescence radiated from the NV center was measured. Referring to FIG. 27, in the measuring device, a configuration for irradiating diamond magneto-optical sensor 210 with excitation light (that is, an irradiation system) includes a light source 200, a collimate lens 202, a dichroic mirror 204, a sphere lens 206, and an optical fiber 208. A configuration for observing fluorescence radiated from diamond magneto-optical sensor 210 (that is, an observation system) includes optical fiber 208, sphere lens 206, dichroic mirror 204, an LPF (Long Pass Filter) 212, and a photodetector 214. A configuration for irradiating diamond magneto-optical sensor 210 with microwaves (that is, a microwave system) includes a coaxial cable 220, a microwave irradiation unit 222, and a terminating resistor 224.

For light source 200 for generating excitation light, an LD (laser diode) element (specifically, L515A1 of Thorlabs, Inc.) was used, and a green laser beam (that is, excitation light) of 5 mW was generated. Excitation light outputted from light source 200 was condensed through collimate lens 202 and then was emitted to dichroic mirror 204. For collimate lens 202, LA1116-A of Thorlabs, Inc. was used. For dichroic mirror 204, S06-RG of SURUGA SEIKI Co., Ltd. was used. Excitation light (that is, green light) incident on dichroic mirror 204 is reflected by dichroic mirror 204. The reflected light was condensed through sphere lens 206, was caused to enter optical fiber 208 (specifically, the core), was transmitted through optical fiber 208, and then was emitted to diamond magneto-optical sensor 210. For sphere lens 206, MS-08-4.35P1 (8 mm in diameter) of OptoSigma Corporation was used. For optical fiber 208, an optical digital cable having a core diameter $\phi$ of 0.9 mm was used.

In fluorescence radiated from diamond magneto-optical sensor 210, fluorescence having entered optical fiber 208 is propagated through optical fiber 208, is transformed into parallel rays through sphere lens 206, and then is emitted to dichroic mirror 204. Fluorescence (that is, red light) incident on dichroic mirror 204 passes through dichroic mirror 204 and enters LPF 212. Fluorescence having passed through LPF 212 was detected by photodetector 214. LPF 212 allows the passage of light at a predetermined wavelength or longer and cuts (e.g., reflects) light at a wavelength shorter than the predetermined wavelength. For LPF 212, LOPF-25C-593 of OptoSigma Corporation was used. For photodetector 214, a photodiode (specifically, S6967 of Hamamatsu Photonics K.K.) was used. Radiated light of diamond is red light passing through LPF 212, whereas excitation light having a shorter wavelength than red light does not pass through LPF 212. Thus, excitation light emitted from light source 200 was detected as noise by photodetector 214, thereby suppressing a reduction in the sensitivity of detection.

Figure 28:
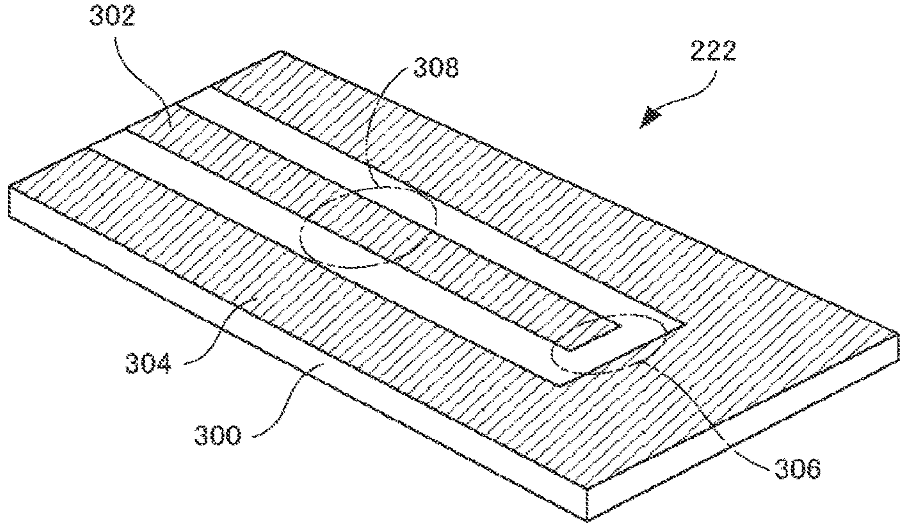
FIG. 28 is a perspective view illustrating the configuration of a microwave irradiation unit in FIG. 27.

Microwaves (1 W) generated by a microwave generator (not illustrated) were transmitted to diamond magneto-optical sensor 210 by using coaxial cable 220 and microwave irradiation unit 222. For coaxial cable 220, a coaxial cable with a characteristic impedance of 50Ω was used. Referring to FIG. 28, microwave irradiation unit 222 is a coplanar line in which electric conductors 302 and 304 are separately formed on a surface of an insulating flexible substrate 300. Electric conductors 302 and 304 are made of copper foil and are terminated in an area 306 by using terminating resistor 224 (see FIG. 27) of 50Ω. Diamond magneto-optical sensor 210 (see FIG. 27) was disposed in an area 308. The frequencies of microwaves emitted to diamond magneto-optical sensor 210 were changed in the range of 2.74 GHZ to 2.94 GHz, excitation light was emitted to diamond magneto-optical sensor 210, and the output voltage of photodetector 214 was measured as an observation of generated fluorescence.

Figure 29:
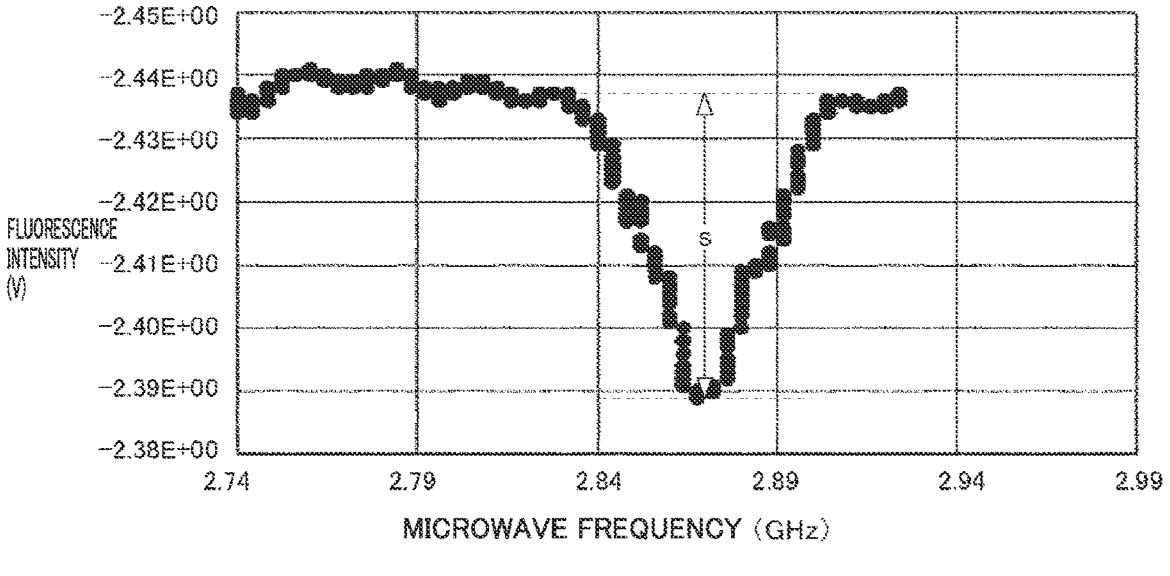
FIG. 29 is a graph showing experimental results.
Figure 30:
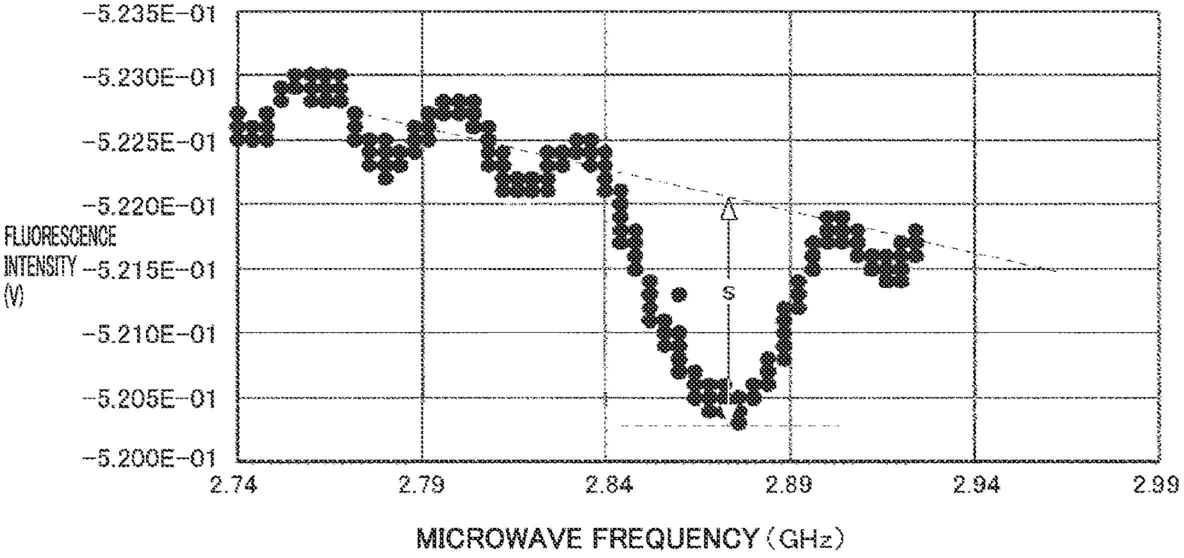
FIG. 30 is a graph showing comparison results.

The measurement results are shown in FIGS. 29 and 30. FIG. 29 shows the result of a corner-cube diamond used as diamond magneto-optical sensor 210. FIG. 30 shows the result of a comparative example in which a flat-shaped diamond used as diamond magneto-optical sensor 210. The vertical axis indicates a voltage (V) representing the intensity of fluorescence, and the horizontal axis indicates a microwave frequency. Black circles indicate plotted measurement data.

According to the result of FIG. 29, the intensity of fluorescence was about 2440 mV, and a spin detection contrast ratio (that is, a decreasing rate of red light brightness, that is, a value obtained by dividing a decrease s in the graph by the intensity of fluorescence) of about 2% was obtained. Thus, signal strength obtained by multiplying these values is about 50 mV. According to the graph of FIG. 30, the intensity of fluorescence was about 520 mV and a contrast ratio of about 0.3% was obtained. Signal strength obtained by multiplying these values is about 1.7 mV. Thus, by using the corner-cube diamond magneto-optical sensor, the intensity of fluorescence was increased by about five times and the contrast ratio was increased by about six times. This considerably increased the signal strength by about 30 times.

Example 2

As in Example 1, for the diamond magneto-optical sensor, an element cut in the shape of a corner cube in FIG. 3 and a flat-shaped element as a comparative example were used to conduct an experiment in which excitation light and fluorescence were spatially transmitted.

A diamond magneto-optical sensor was produced as in Example 1. Specifically, a diamond of type Ib was used. Electrons were injected into the diamond with an electron acceleration energy of 3 MeV and an electron dose of $3\times10^{18}/cm^2$, and then the diamond was annealed at 800° C. for about one hour, so that the diamond including an NV center was generated. The diamond was cut into a corner cube with an oblique side of 1 mm, and a small portion (that is, a portion where excitation light is incident on the diamond) was formed at an apex of the cube, so that a diamond magneto-optical sensor was produced. Moreover, the diamond was cut into a cube with a side of 1 mm to produce a diamond magneto-optical sensor as a comparative example.

Figure 31:
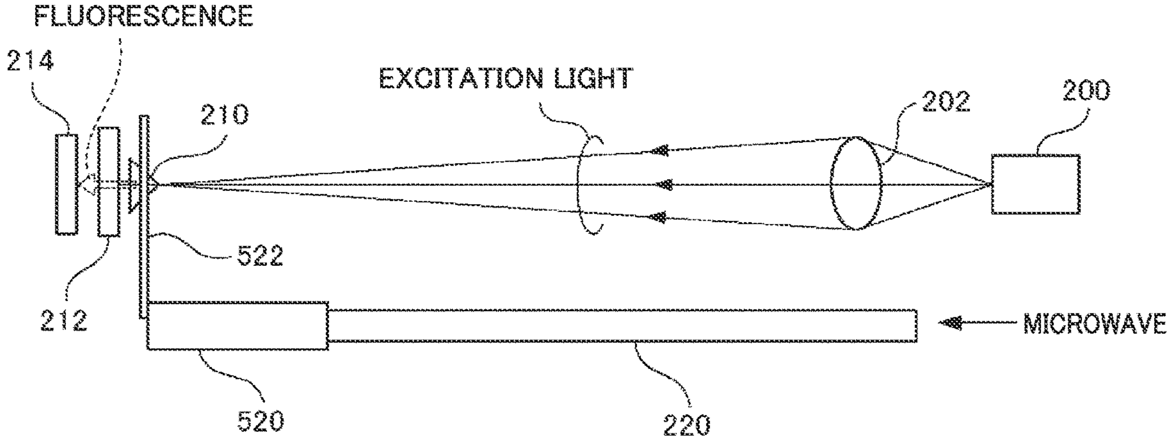
FIG. 31 is a schematic diagram illustrating the configuration of Example 2.

By using a measuring device configured as illustrated in FIG. 31, the apex (that is, the small portion) of the diamond magneto-optical sensor including the NV center was irradiated with excitation light (see FIG. 18), and the intensity of fluorescence radiated from the NV center was measured. Referring to FIG. 31, in the measuring device, a configuration for irradiating diamond magneto-optical sensor 210 with excitation light (that is, an irradiation system) includes light source 200 and collimate lens 202. A configuration for observing fluorescence radiated from diamond magneto-optical sensor 210 (that is, an observation system) includes LPF 212 and photodetector 214. A configuration for irradiating diamond magneto-optical sensor 210 with microwaves (that is, a microwave system) includes coaxial cable 220, a λ/4 transformer 520, and a λ/4 open stub 522.

Light source 200, collimate lens 202, and photodetector 214 were identical to those of Example 1. Unlike in Example 1, FGL590 of Thorlabs, Inc. was used for LPF 212. For coaxial cable 220, a coaxial cable with a characteristic impedance of 50Ω was used as in Example 1. λ/4 transformer 520 included a microstrip line with an impedance of 20Ω. λ/4 open stub 522 included parallel two lines with an impedance of 300Ω. λ/4 transformer 520 acted as an impedance converter, accurately converted an impedance between coaxial cable 220 and λ/4 open stub 522 acting as a resonator, and efficiently irradiated the diamond magneto-optical sensor 210 with microwaves.

Green light of 5 mW was emitted as excitation light. The spot of the excitation light was reduced to a diameter of 20 μm with a power density of 3 $W/mm^2$. The frequencies of microwaves of 1 W were swept in the range of 2.74 GHz to 2.94 GHz, excitation light was emitted to diamond magneto-optical sensor 210, and generated fluorescence was measured. Consequently, a response speed of 30 us was obtained in both of the diamond cut in a corner cube and the diamond of the comparative example. A photocurrent in the photodiode of photodetector 214 was 10 μA, which corresponds to the intensity of fluorescence, in the diamond of the comparative example, whereas a photocurrent of 100 μA was obtained in the diamond cut in a corner cube.

The present disclosure was described according to the description of the embodiment. The embodiment was merely exemplary and the present disclosure is not limited to the embodiment. The scope of the present disclosure is indicated by the claims in consideration of the detailed description of the invention. The scope of the present disclosure includes meanings equivalent to the language of the claims and all changes in the scope.

REFERENCE SIGNS LIST

- 100, 120, 130, 140, 150, 160, 210, 400, 420, 430, 440, 450, 460, 470, 480 Diamond magneto-optical sensor
- 102, 208, 408 Optical fiber
- 104 NV center
- 106, 404, 424, 434, 444, 456, 466, 476, 486 Reflecting surface
- 108 Vertical plane
- 110, 112 Condensing element
- 122 Diamond
- 124, 452, 462, 472, 482 Glass
- 126, 132, 142, 152, 162 Entrance surface
- 128, 134, 144, 154, 164 Reflecting surface
- 136 Focal point
- 200, 500 Light source
- 202, 502, 506, 508 Collimate lens
- 204, 504 Dichroic mirror
- 206 Sphere lens
- 212 LPF
- 214, 510 Photodetector
- 220 Coaxial cable

222 Microwave irradiation unit
224 Terminating resistor
300 Flexible substrate
302, 304 Electric conductor
306, 308 Area
402, 422, 432, 442, 454, 464, 474, 484 Small portion
410 Output surface
520 λ/4 transformer
522 λ/4 open stub
A, B, C, D point
a, b, c, d, e, f, g, h, i Length
o Center
r Radius
α, β, γ, δ, θ Angle

The invention claimed is:

1. A diamond magneto-optical sensor comprising:

a diamond including a color center with an electronic spin;

a small portion that allows excitation light propagated through an optical system to be emitted into the diamond, and a reflecting surface that reflects radiated light radiated from the color center excited by the excitation light incident from the small portion and condenses the radiated light in a direction of a light-receiving optical system that guides the light to a light-receiving element, wherein the reflecting surface has a larger area than the small portion and guides the light radiated from the same position in different directions, to the light-receiving optical system through a plurality of optical paths, wherein the excitation light is emitted to the diamond from an output part of the optical system, and wherein the reflecting surface condenses the radiated light at the output part of the optical system.

2. The diamond magneto-optical sensor according to claim 1, wherein the optical system includes an optical fiber such that excitation light is emitted to the diamond from an output part of the optical fiber through the small portion, and the radiated light condenses at the output part of the optical fiber through the reflecting surface.

3. A diamond magneto-optical sensor comprising:

a diamond including a color center with an electronic spin;

a small portion that allows excitation light propagated through an optical system to be emitted into the diamond, and a reflecting surface that reflects radiated light radiated from the color center excited by the excitation light incident from the small portion and condenses the radiated light in a direction of a light-receiving optical system that guides the light to a light-receiving element, wherein the reflecting surface has a larger area than the small portion and guides the light radiated from the same position in different directions, to the light-receiving optical system through a plurality of optical paths, and wherein the optical system includes an optical fiber, and a size of the diamond is one third or more and three times or less a core diameter of the optical fiber.

* * * * *